(12) United States Patent
Shiozawa et al.

(10) Patent No.: US 6,333,540 B1
(45) Date of Patent: Dec. 25, 2001

(54) SEMICONDUCTOR DEVICE MANUFACTURING METHOD AND SEMICONDUCTOR DEVICE

(75) Inventors: Katsuomi Shiozawa; Syuichi Ueno; Yasuyoshi Itoh, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/668,472

(22) Filed: Sep. 25, 2000

(30) Foreign Application Priority Data

Apr. 19, 2000 (JP) .................................................. 12-117757

(51) Int. Cl.$^7$ .................................................. H01L 27/01
(52) U.S. Cl. ........................................... 257/351; 438/596
(58) Field of Search .................................. 257/351, 371, 257/407, 67, 221; 438/334, 595, 596, 199

(56) References Cited

U.S. PATENT DOCUMENTS

| | | | |
|---|---|---|---|
| 5,804,858 | * | 9/1998 | Hsu et al. ........................... 257/347 |
| 6,093,610 | * | 7/2000 | Rodder ................................ 438/289 |
| 6,177,323 | * | 1/2001 | Wu ...................................... 438/300 |

OTHER PUBLICATIONS

Atsushi Yagishita, et al. "High Performance Metal Gate MOSFETs Frabricated by CMP for 0.1 μm Regime", 1998 IEEE, IEDM pp. 785–788.

Saito et al. "P–MOSFET's with Ultra–Shallow Solid–Phase– Diffused Drain Structure Produced by Diffusion from BSG Gate–Sidewall". IEEE Transactions on electron device, vol. 40, No. 12, Dec. 1993, pp. 2264–2271.*

* cited by examiner

*Primary Examiner*—David Nelms
*Assistant Examiner*—Quoc Hoang
(74) *Attorney, Agent, or Firm*—Oblon, Spivak, McClelland, Maier & Neustadt, P.C.

(57) ABSTRACT

A semiconductor device and manufacturing method capable of forming shallow extension regions in insulated-gate transistors. A side wall material containing about 1 to 20% of phosphorus, such as PSG, is deposited on the sides of an opening to a film thickness of tens of nanometers to about 100 nm and etched back to form phosphorus-containing side walls respectively adjacent to boron-containing side walls. An interlayer insulating film of silicon nitride etc. is then formed on the silicon nitride film. A thermal process performed during formation of the interlayer insulating film forms N-type extension regions in the NMOS region through a diffusion where phosphorus contained in the phosphorus-containing side walls serves as the diffusion source and P-type extension region in the PMOS region through a diffusion where boron contained in the boron-containing side walls serves as the diffusion source.

3 Claims, 31 Drawing Sheets

F I G . 1
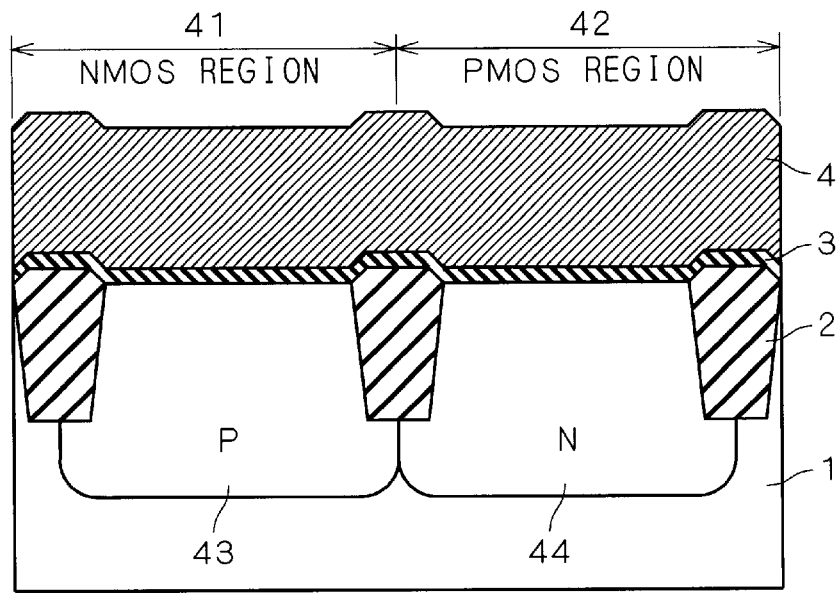
F I G . 2
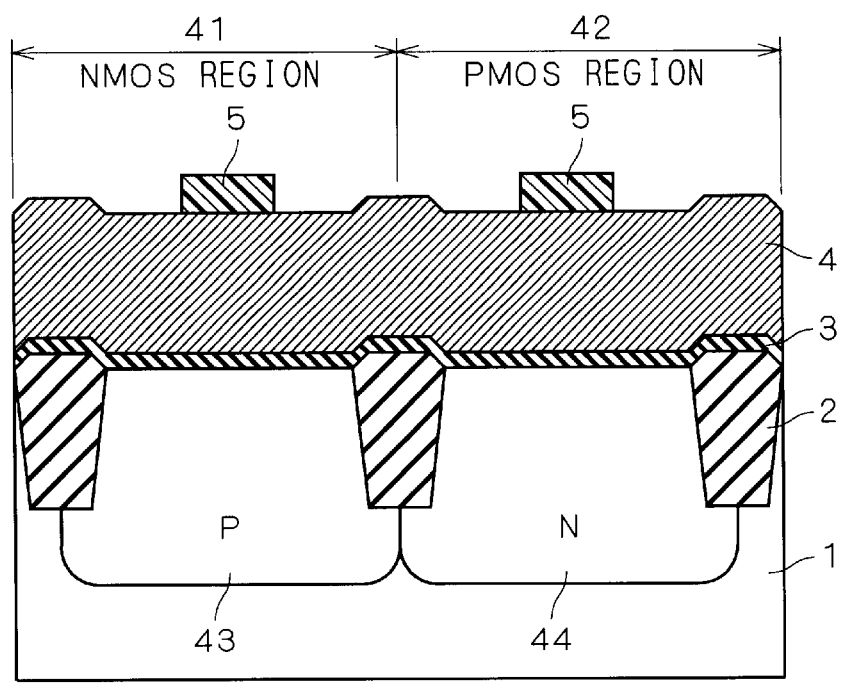

F I G . 10
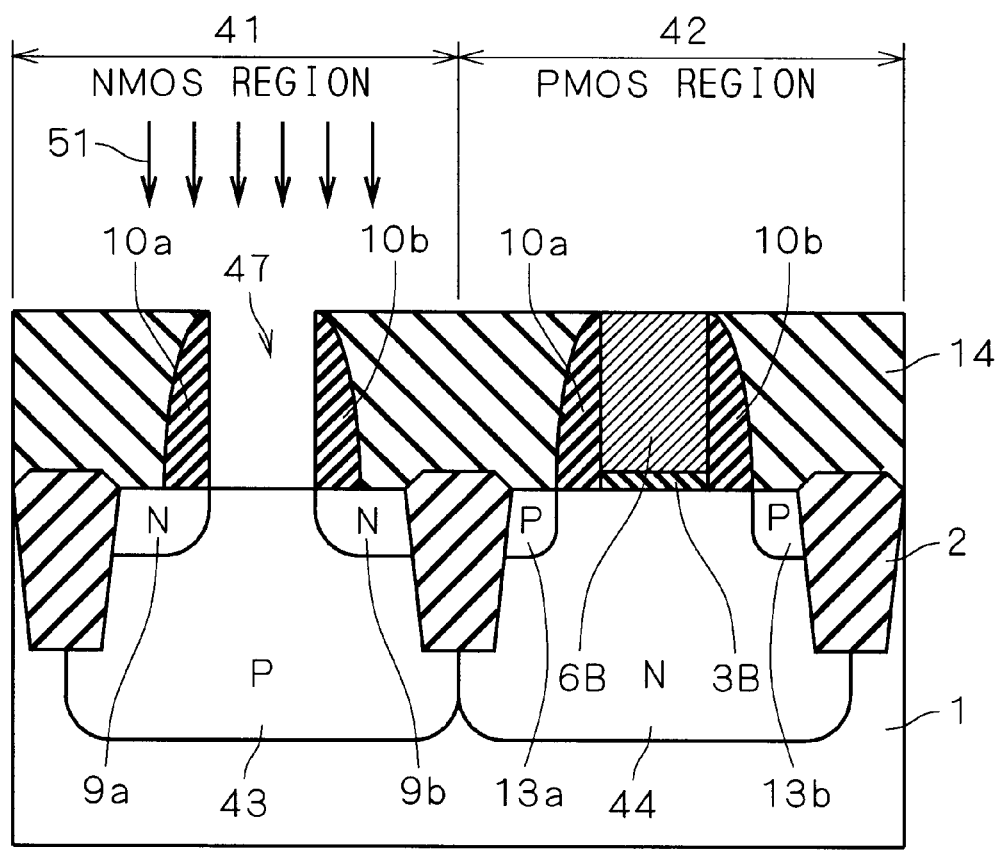

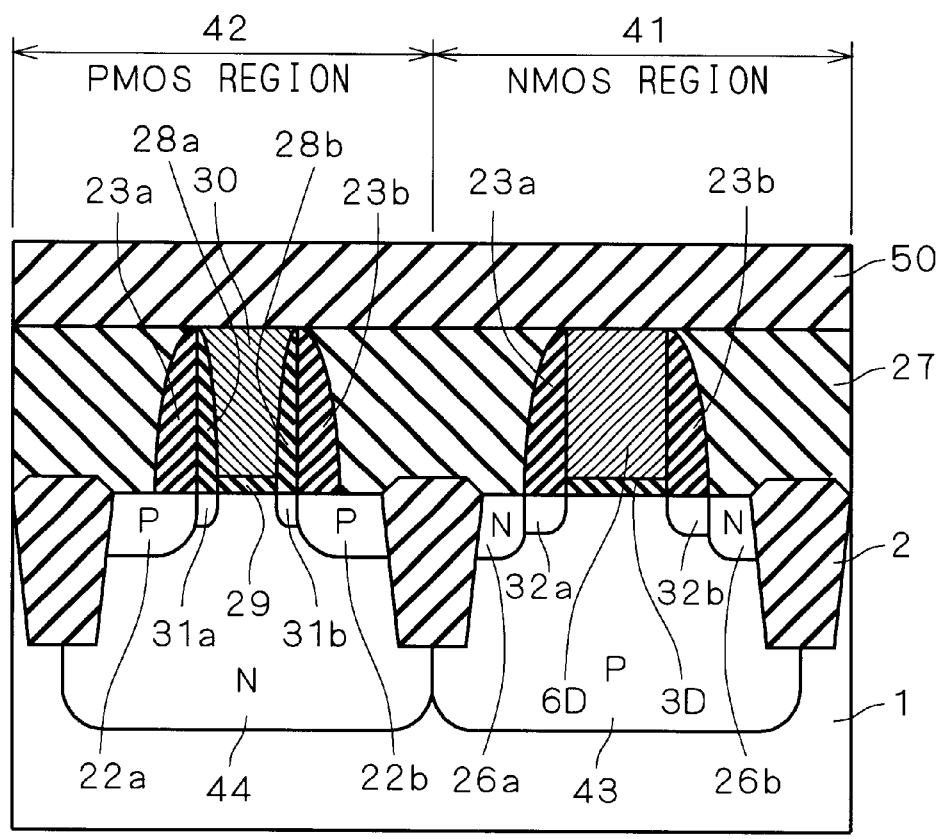
F I G . 19

F I G . 4 2
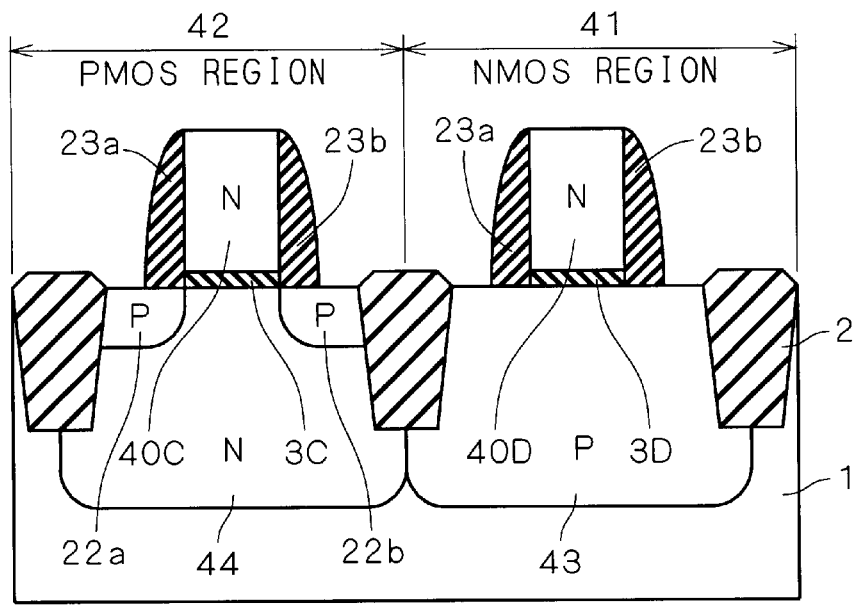
F I G . 4 3
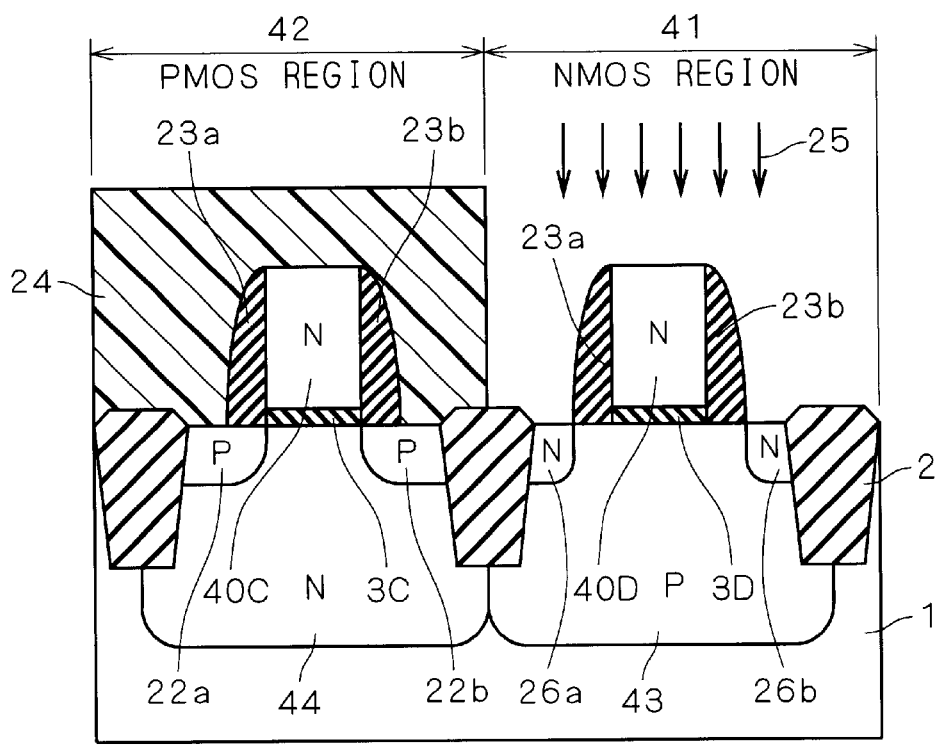

F I G . 44
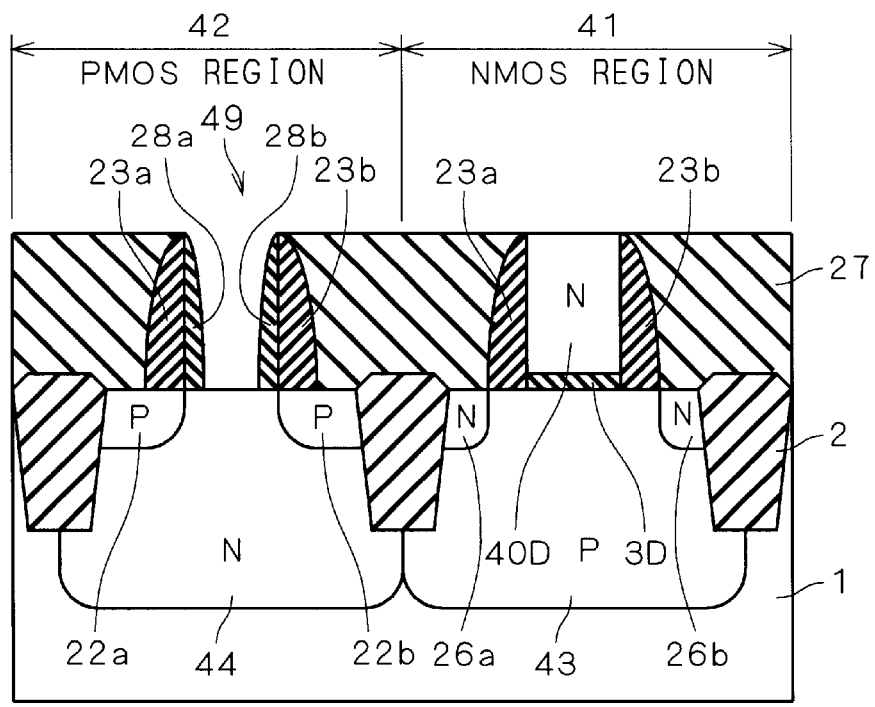
F I G . 45
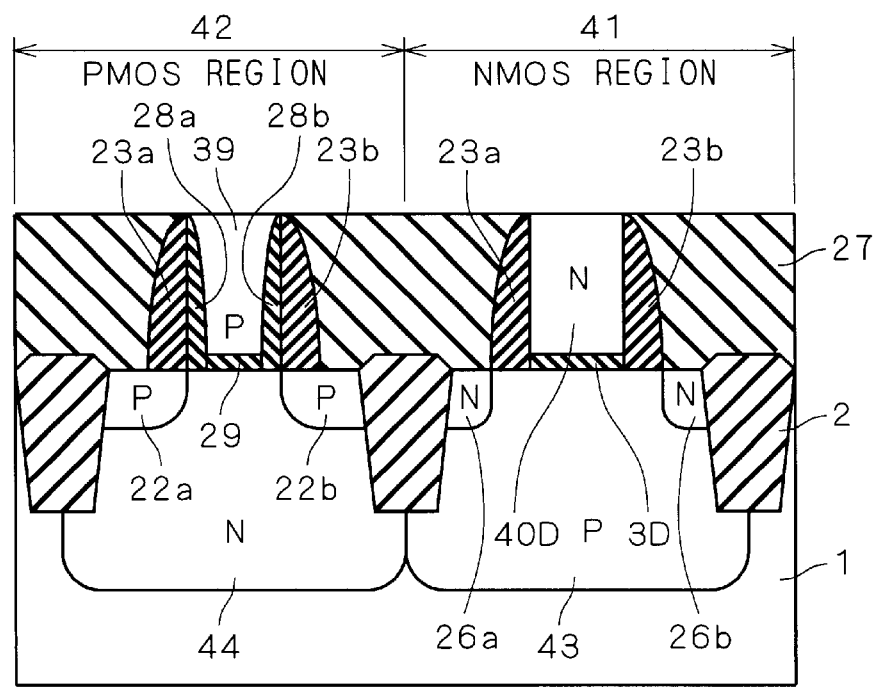

F I G . 53
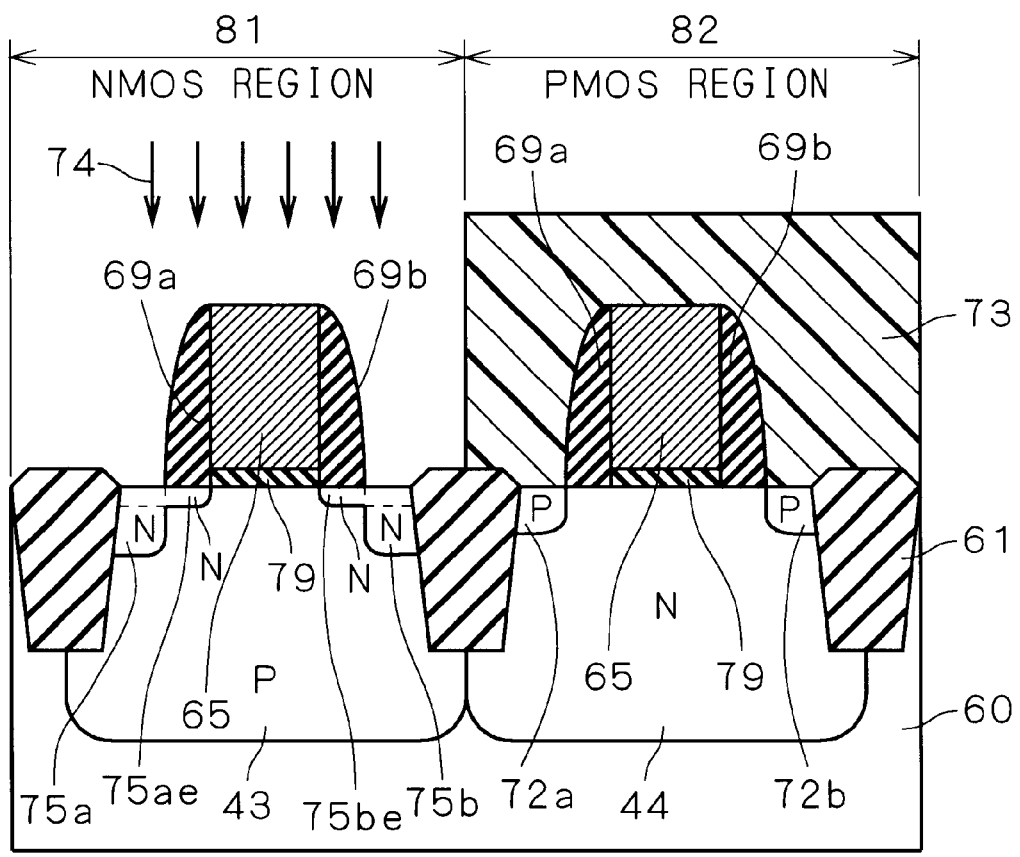

F I G . 54
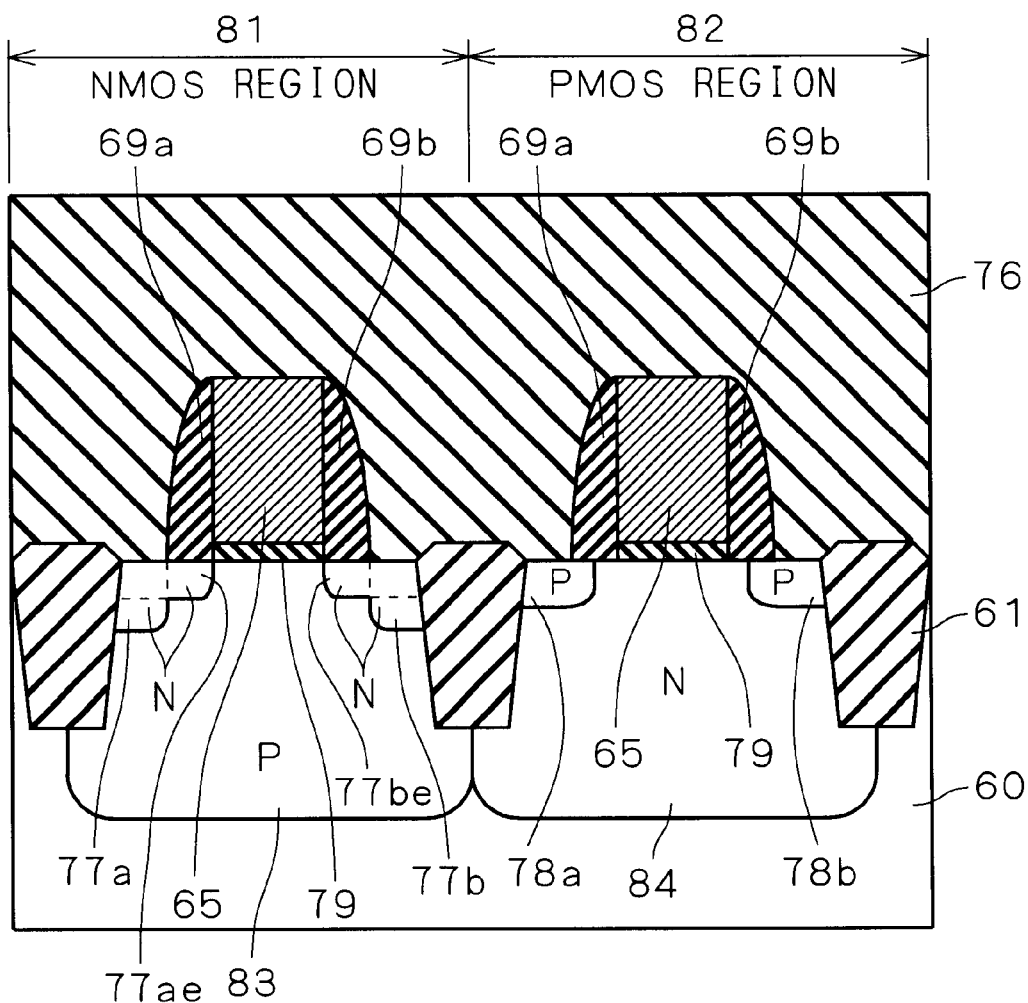

SEMICONDUCTOR DEVICE MANUFACTURING METHOD AND SEMICONDUCTOR DEVICE

BACKGROUND OF THE INVENTION

1. Field of the Invention

The present invention relates to a semiconductor device manufacturing method, and particularly to a method for manufacturing MOS transistors used in DRAMs, logic circuits, etc.

2. Description of the Background Art

FIGS. 47 to 54 are sectional views showing a conventional method for manufacturing CMOS transistors (CMOSFETs). The CMOS transistor manufacturing method will now be described referring to these diagrams.

First, as shown in FIG. 47, element isolation regions 61 are selectively formed in the upper part of a silicon substrate 60. Next, a P well region 83 and an N well region 84 (both of which include a channel region) are formed by ion implantation etc. in the NMOS region 81 and the PMOS region 82 which are isolated by the element isolation regions 61. A silicon oxide film 62 and a polysilicon layer 63 are then sequentially deposited on the entire surface of the silicon substrate 60.

Next, as shown in FIG. 48, resist 64 is formed on the polysilicon layer 63 and patterned by photolithography.

Next, as shown in FIG. 49, the polysilicon layer 63 and the silicon oxide film 62 are etched using the patterned resist 64 as a mask to obtain gate electrodes (interconnections) 65 and gate oxide films 79.

Subsequently, as shown in FIG. 50, resist 66 is formed on the entire surface and patterned so that it remains only in the PMOS region 82, and N-type impurity ions 67 are implanted relatively shallowly from the surface of the silicon substrate 60 by using the patterned resist 66 and the gate electrode 65 in the NMOS region 81 as masks to obtain N-type diffusion regions 68 (68a and 68b).

Next, as shown in FIG. 51, a silicon oxide film is deposited on the entire surface and etched back to form side walls 69 (69a and 69b) of silicon oxide film on the sides of the gate electrodes 65.

Subsequently, as shown in FIG. 52, resist 70 is formed on the entire surface and patterned so that the resist 70 remains only in the NMOS region 81, and P-type impurity ions 71 are implanted relatively deep from the surface of the silicon substrate 60 by using the patterned resist 70 and the gate electrode 65 and side walls 69 in the PMOS region 82 as masks, so as to obtain P-type diffusion regions 72 (72a and 72b). The P-type diffusion regions 72 are formed deeper from the surface of the silicon substrate 60 than the N-type diffusion regions 68.

Next, as shown in FIG. 53, resist 73 is formed all over the surface and patterned so that the resist 73 remains only in the PMOS region 82. N-type impurity ions 74 are then implanted relatively deep from the surface of the silicon substrate 60 by using the patterned resist 73 and the gate electrode 65 and side walls 69 in the NMOS region 81 as masks, thus forming N-type diffusion regions 75 (75a and 75b) which are merged with the previously formed N-type diffusion regions 68 to form main source/drain regions.

The N-type diffusion regions 75 serve as the source/drain regions of the NMOS transistor and the N-type diffusion regions 75 under the side walls 69 serve as extension regions 75ae and 75be which are shallower from the surface of the silicon substrate 60.

Next, as shown in FIG. 54, an interlayer insulating film 76 of silicon oxide film is deposited all over the surface. A thermal process applied in this process causes the N-type diffusion regions 75 and the P-type diffusion regions 72 to further diffuse to form N-type diffusion regions 77 (77a and 77b) and P-type diffusion regions 78 (78a and 78b). Accordingly, the formation depth of the extension regions 77ae and 77be in the N-type diffusion regions 77 is deeper than that of the extension regions 75ae and 75be. Also, the formation depth of the extension regions 77ae and 77be is made deeper than that of the N-type diffusion regions 68 by thermal processes performed between the formation of the N-type diffusion regions 68 and the formation of the interlayer insulating film 76.

The semiconductor device having the CMOS transistors is then completed through existing processes such as interconnecting etc.

Important factors to enhance the driving capability and operating speed of MOSFETs and improve the short-channel characteristic include the reduction of gate dimension (gate length), reduction of source/drain resistance, and formation of shallower PN junctions.

Among these factors, obtaining shallower PN junctions, or forming shallower extension regions, can be achieved by reducing the amount of thermal treatments which are performed after the formation of the extension regions and contribute to the impurity diffusion. However, in the conventional CMOS transistor manufacturing method as shown in FIGS. 47 to 54, thermal processes such as annealing are performed, after the formation of the N-type diffusion regions 68 as extension regions, to form the side walls 69 and to activate the N-type diffusion regions 75 as the main source/drain regions; the thermal processes diffuse the extension regions further deeper, which makes it difficult to form shallower PN junctions.

SUMMARY OF THE INVENTION

According to a first aspect of the present invention, a semiconductor device manufacturing method comprises the steps of: (a) forming first and second main source/drain regions of a first conductivity type in a surface of a semiconductor substrate and a temporary gate electrode portion on the semiconductor substrate between the first and second main source/drain regions; (b) forming first and second auxiliary side walls on sides of the temporary gate electrode portion; (c) removing the temporary gate electrode portion to obtain an opening whose sides are defined by the first and second auxiliary side walls; (d) forming first and second extension-forming side walls adjacent respectively to the first and second auxiliary side walls in the opening, the first and second extension-forming side walls containing a first extension-forming impurity of the first conductivity type; (e) after the step (d), sequentially forming a first real gate insulating film and a first real gate electrode in the opening to obtain a first real gate electrode portion; and (f) forming first and second extension regions of the first conductivity type adjacent respectively to the first and second main source/drain regions through a first diffusion process where the first extension-forming impurity in the first and second extension-forming side walls serves as a diffusion source, wherein the first real gate insulating film, the first real gate electrode, the first and second main source/drain regions and the first and second extension regions define an insulated-gate, first transistor of the first conductivity type.

Preferably, according to a second aspect of the invention, in the semiconductor device manufacturing method, the step (f) includes a step of forming an interlayer insulating film all over the surface of the semiconductor substrate including the first transistor, and the first diffusion process includes a diffusion process utilizing a thermal process carried out during formation of the interlayer insulating film.

Preferably, according to a third aspect of the invention, in the semiconductor device manufacturing method, the first and second extension-forming side walls include side walls further containing a pocket-forming impurity of a second conductivity type, and the step (f) comprises a step of further forming first and second pocket regions adjacent to the first and second main source/drain regions through a second diffusion process where the pocket-forming impurity serves as a diffusion source.

Preferably, according to a fourth aspect of the invention, in the semiconductor device manufacturing method, the pocket-forming impurity has a larger diffusion coefficient than the first extension-forming impurity.

Preferably, according to a fifth aspect of the invention, in the semiconductor device manufacturing method, the step (f) includes a step of forming an interlayer insulating film all over the surface of the semiconductor substrate including the first transistor, and the first and second diffusion processes include diffusion processes performed at the same time by utilizing a thermal process carried out during formation of the interlayer insulating film.

Preferably, according to a sixth aspect of the invention, in the semiconductor device manufacturing method, the first real gate electrode is formed using a gate electrode material including a gate electrode material of the first conductivity type.

Preferably, according to a seventh aspect of the invention, the semiconductor device manufacturing method further comprises the step of: (g) performing an impurity introducing process in which an impurity of a second conductivity type is introduced into a predetermined semiconductor region at least including the region in the surface of the semiconductor substrate under the region where the first real gate electrode portion is to be formed.

Preferably, according to an eighth aspect of the invention, in the semiconductor device manufacturing method, the step (g) includes a step performed after the step (c), and the impurity introducing process includes an ion implantation process of implanting impurity ions of the second conductivity type through the opening.

Preferably, according to a ninth aspect of the invention, in the semiconductor device manufacturing method, the semiconductor substrate includes first and second formation regions and the temporary gate electrode portion is composed of a stacked structure of a temporary gate insulating film and a temporary gate electrode. The step (a) includes the steps of: (a-1) forming the temporary gate electrode portion on the first formation region and forming a second real gate electrode portion having a stacked structure of a second real gate insulating film and a second real gate electrode on the second formation region; and (a-2) introducing a first source/drain forming impurity of the first conductivity type by using the temporary gate electrode portion as a mask to form the first and second main source/drain regions, and the step (b) includes a step of further forming third and fourth extension-forming side walls on sides of the second real gate electrode, the third and fourth extension-forming side walls contain a second extension-forming impurity of a second conductivity type. The manufacturing method further comprises the step of (h) after the step (b), introducing a second source/drain forming impurity of the second conductivity type by using the second real gate electrode and the third and fourth extension-forming side walls as masks to form third and fourth main source/drain regions of the second conductivity type in the surface of the second formation region in areas separated by the region under the second real gate electrode and the third and fourth extension-forming side walls, and the step (f) includes a step of further forming third and fourth extension regions of the second conductivity type adjacent respectively to the third and fourth main source/drain regions through a third diffusion process where the second extension-forming impurity in the third and fourth extension-forming side walls serves as a diffusion source. The second real gate insulating film, the second real gate electrode, the third and fourth main source/drain regions and the third and fourth extension regions define an insulated-gate, second transistor of the second conductivity type.

Preferably, according to a tenth aspect of the invention, in the semiconductor device manufacturing method, the first and second auxiliary side walls include side walls containing the second extension-forming impurity, and the step (b) includes a step of simultaneously forming the first and second auxiliary side walls and the third and fourth extension-forming side walls.

Preferably, according to an eleventh aspect of the invention, in the semiconductor device manufacturing method, the first real gate electrode is formed by using a gate electrode material including a gate electrode material of the first conductivity type, and the second real gate electrode is formed by using a gate electrode material including a gate electrode material of the second conductivity type.

Preferably, according to a twelfth aspect of the invention, in the semiconductor device manufacturing method, the temporary gate electrode is formed by using a gate electrode material including a gate electrode material of the second conductivity type, and the step (a-1) includes a step of simultaneously forming the temporary gate electrode and the second real gate electrode.

A thirteenth aspect of the present invention is directed to a semiconductor device having an insulated-gate transistor of a first conductivity type. The semiconductor device comprises: a semiconductor substrate having a predetermined semiconductor region of a second conductivity type in its surface; a gate insulating film selectively formed on the predetermined semiconductor region, the surface of the predetermined semiconductor region under the gate insulating film being defined as a channel region; a gate electrode formed on the gate insulating film; first and second extension-forming side walls formed on sides of the gate electrode and containing an extension-forming impurity of the first conductivity type; first and second auxiliary side walls adjacent respectively to the first and second extension-forming side walls; and first and second source/drain regions separated by the channel region in the surface of the predetermined semiconductor region, wherein the gate insulating film, the gate electrode and the first and second source/drain regions define the transistor, and the source/drain regions include first and second extension regions which are shallower than other regions and formed under the first and second extension-forming side walls.

Preferably, according to a fourteenth aspect of the invention, in the semiconductor device, the first and second extension-forming side walls further include a pocket-forming impurity of the second conductivity type, and the source/drain regions further include first and second pocket regions of the second conductivity type formed under the first and second extension-forming side walls.

Preferably, according to a fifteenth aspect of the invention, in the semiconductor device, the gate electrode is formed by using a gate electrode material including a gate electrode material of the first conductivity type.

As stated above, according to the semiconductor device manufacturing method of the first aspect of the invention, in the step (f) performed after formation of the first and second main source/drain regions, the first and second extension regions of the first conductivity type respectively adjacent to the first and second main source/drain regions are formed by the first diffusion process where the first extension-forming impurity in the first and second extension-forming side walls serves as the diffusion source.

Accordingly, a thermal process performed during formation of the first and second main source/drain regions does not affect the first and second extension regions at all. Thus removing the effect of the thermal process performed during formation of the first and second main source/drain regions allows the first and second extension regions to have a shallow formation depth.

Further, forming the first and second extension-forming side walls adjacent to the previously formed first and second auxiliary side walls allows the extension regions to be precisely positioned next to the main source/drain regions during the first diffusion process.

In the semiconductor device manufacturing method of the second aspect, the first diffusion process in the step (f) utilizes a thermal process performed during formation of an interlayer insulating film. Accordingly the extension regions can be formed without the need for adding a separate process for forming the extension regions.

In the semiconductor device manufacturing method of the third aspect, the step (f) further forms first and second pocket regions through the second diffusion process where the pocket-forming impurity serves as the diffusion source. Accordingly it is possible to manufacture the insulated-gate, first transistor having the pocket regions as well as the extension regions in areas adjacent to the main source/drain regions.

In the semiconductor device manufacturing method of the fourth aspect, the pocket-forming impurity has a larger diffusion coefficient than the first extension-forming impurity. The difference in diffusion coefficient causes the first and second extension regions to form in relatively shallow regions from the semiconductor substrate surface and the first and second pocket regions to form in relatively deep regions from the semiconductor substrate surface, whereby the first and second extension regions and the first and second pocket regions are certainly formed in separate areas.

In the semiconductor device manufacturing method of the fifth aspect, the first and second diffusion processes in the step (f) are carried out at the same time by utilizing a thermal process performed during formation of the interlayer insulating film. The first and second extension regions and the first and second pocket regions can thus be formed at the same time without the need for adding a separate process for forming the extension regions and the pocket regions.

In the semiconductor device manufacturing method of the sixth aspect, the gate electrode material used to form the first real gate electrode includes a gate electrode material of the first conductivity type, so that the first real gate electrode can be adapted to the work function of the first transistor of the first conductivity type.

The step (g) in the semiconductor device manufacturing method of the seventh aspect provides a first transistor in which the region in the surface of the semiconductor substrate under the region where the first real gate electrode portion is formed serves as a channel region of the second conductivity type.

In the semiconductor device manufacturing method of the eighth aspect, the step (g) includes an ion implantation process of implanting impurity ions of the second conductivity type through the opening, which allows the second-conductivity-type channel region to be formed in precise position under the first real gate electrode formed in the opening in the step (e).

Furthermore, since the channel region is formed after the first and second main source/drain regions have been formed, it is possible to remove the effect of impurity redistribution caused by a thermal process performed during formation of the main source/drain regions.

In the semiconductor device manufacturing method of the ninth aspect, the step (f) further forms third and fourth extension regions of the second conductivity type through the third diffusion process where the second extension-forming impurity in the third and fourth extension-forming side walls is used as the diffusion source.

Accordingly, a thermal process performed during formation of the third and fourth main source/drain regions does not affect the third and fourth extension regions at all. Since the effect of the thermal processing during formation of the third and fourth main source/drain regions is thus removed, the third and fourth extension regions can be formed to a shallow formation depth.

Moreover, the temporary gate electrode portion and the second real gate electrode portion both have a stacked structure composed of a gate insulating film (the temporary gate insulating film and the second real gate insulating film) and a gate electrode (the temporary gate electrode and the second real gate electrode). Hence, when the temporary gate insulating film and the temporary gate electrode are formed with the same materials respectively as the second real gate insulating film and the second real gate electrode, the temporary gate electrode portion and the second real gate electrode portion can be formed at the same time so as to simplify the manufacturing process.

In the semiconductor device manufacturing method of the tenth aspect, the first and second auxiliary side walls and the third and fourth extension-forming side walls both containing the second extension-forming impurity can be formed at the same time so as to simplify the manufacturing process.

In the semiconductor device manufacturing method of the eleventh aspect, the gate electrode materials used to form the first and second real gate electrodes respectively include first- and second-conductivity-type gate electrode materials, so that the first and second real gate electrodes can be adapted to the work functions of the first and second transistors of the first and second conductivity types, respectively.

In the semiconductor device manufacturing method of the twelfth aspect, the temporary gate electrode and the second real gate electrode both made of a second-conductivity-type gate electrode material can be simultaneously formed in the step (a-1), so that the manufacturing process can be simplified.

In the semiconductor device of the thirteenth aspect, the first and second extension regions formed shallower than other regions under the first and second extension-forming side walls can be obtained by a first diffusion process where the extension-forming impurity in the first and second extension-forming side walls serves as the diffusion source.

Accordingly, for example, the transistor of the thirteenth aspect can be obtained by: implanting an impurity using a temporary gate electrode portion as a mask to form the first and second main source/drain regions; forming the first and second auxiliary side walls adjacent to the temporary gate electrode portion; removing the temporary gate electrode portion to form an opening; forming in the opening the first and second extension-forming side walls adjacent to the first and second auxiliary side walls; forming a real gate electrode portion (the gate insulating film and gate electrode) in the remaining opening; and performing the first diffusion process, where the extension regions can be precisely positioned next to the main source/drain regions.

Furthermore, in the manufacturing process shown above, a thermal process performed during formation of the first and second main source/drain regions does not at all affect the first and second extension regions; removing the effect of the thermal process performed during the formation of the first and second main source/drain regions enables the first and second extension regions to have shallow junction depth.

In the semiconductor device of the fourteenth aspect, the second-conductivity-type first and second pocket regions formed under the first and second extension-forming side walls can be obtained through a second diffusion process where the pocket-forming impurity in the first and second extension-forming side walls is used as the diffusion source.

Thus, precisely positioned first and second pocket regions adjacent to the first and second main source/drain regions can be obtained by performing the second diffusion process after the formation of the first and second main source/drain regions.

In the semiconductor device of the fifteenth aspect, the gate electrode material for forming the gate electrode includes a gate electrode material of the first conductivity type, so that the first real gate electrode can be adapted to the work function of the first transistor of the first conductivity type.

The present invention has been made to solve the aforementioned problem, and an object of the present invention is to provide a semiconductor device manufacturing method capable of forming shallow extension regions in insulated-gate transistors.

These and other objects, features, aspects and advantages of the present invention will become more apparent from the following detailed description of the present invention when taken in conjunction with the accompanying drawings.

BRIEF DESCRIPTION THE DRAWINGS

FIGS. 1 to 10 are sectional views showing an MOS transistor manufacturing method according to a first preferred embodiment of the present invention.

FIGS. 11 to 19 are sectional views showing an MOS transistor manufacturing method according to a second preferred embodiment of the present invention.

FIGS. 38 to 46 are sectional views showing an MOS transistor manufacturing method according to a fifth preferred embodiment of the present invention.

FIGS. 47 to 54 are sectional views showing a conventional MOS transistor manufacturing method.

DESCRIPTION OF THE PREFERRED EMBODIMENTS

<First Preferred Embodiment>

Figure 3:
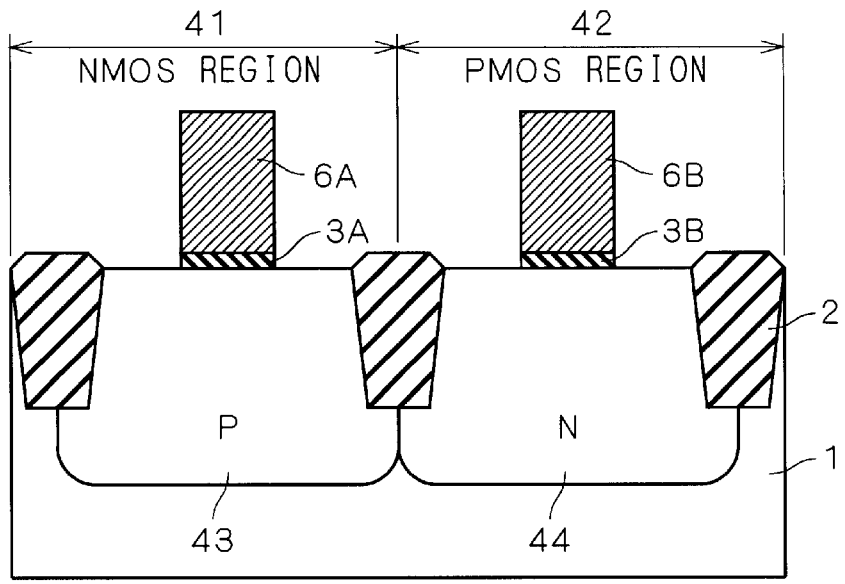

FIGS. 1 to 8 are sectional views showing a method for manufacturing MOS transistors having CMOS structure according to a first preferred embodiment of the present invention. The manufacturing method of the first preferred embodiment is now described referring to these diagrams.

First, as shown in FIG. 1, element isolation regions 2 are selectively formed in the upper part of a silicon substrate 1. Next, a P well region 43 and an N well region 44 (both of which include a channel region) are formed by ion implantation etc. in the NMOS region 41 and the PMOS region 42 which are isolated by the element isolation regions 2, and a silicon oxide film 3 and a polysilicon layer 4 are sequentially deposited on the entire surface of the silicon substrate 1.

Next, as shown in FIG. 2, resist 5 is formed on the polysilicon layer 4 and patterned by photolithography.

Then, as shown in FIG. 3, the polysilicon layer 4 and the silicon oxide film 3 are etched using the patterned resist 5 as a mask to obtain a dummy gate electrode portion (temporary gate electrode portion) composed of a dummy gate electrode (interconnection) 6A and a dummy gate oxide film 3A in the NMOS region 41 and a real gate electrode portion composed of a real gate electrode (interconnection) 6B and a real gate oxide film 3B in the PMOS region 42.

Figure 4:
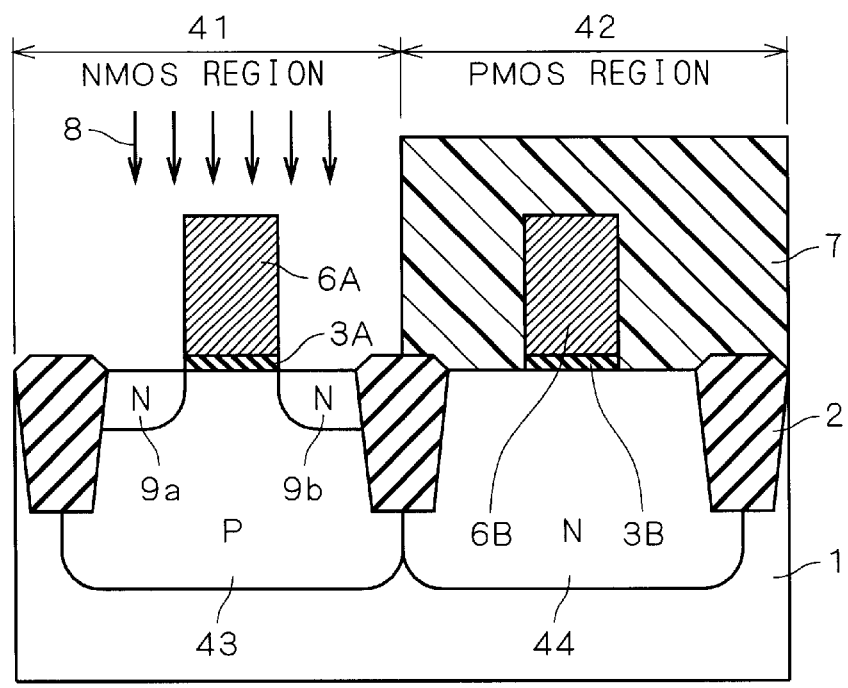

Subsequently, as shown in FIG. 4, resist 7 is formed on the entire surface and patterned so that the resist 7 remains only in the PMOS region 42 and N-type impurity ions 8 are implanted relatively deep from the surface of the silicon substrate 1 by using the patterned resist 7 and the dummy gate electrode 6A in the NMOS region 41 as masks, which is followed by a diffusion process to form N-type diffusion regions 9a and 9b as the main source/drain regions of the NMOS transistor.

Figure 5:
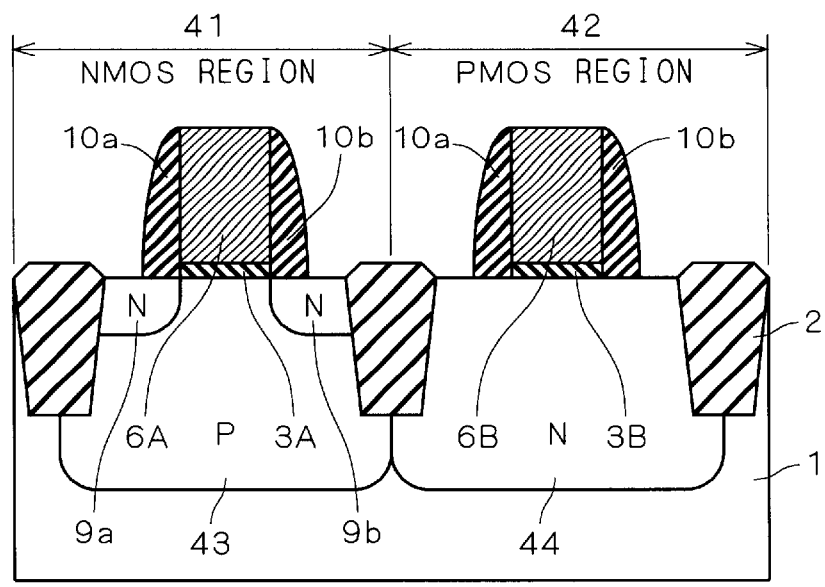

Next, as shown in FIG. 5, a side wall material containing about 1 to 20% of boron, such as BSG (Boron-Silicate Glass), is deposited on the entire surface to a film thickness of tens of nanometers to about 100 nm and etched back to simultaneously form boron-containing side walls 10a and 10b on the sides of the dummy gate electrode portion (6A and 3A) in the NMOS region 41 and the real gate electrode portion (6B and 3B) in the PMOS region 42. In this process, the boron-containing side walls 10a and 10b are formed so that their side wall width falls within 10 to 20% reduction of the deposition thickness of the side wall material.

Figure 6:
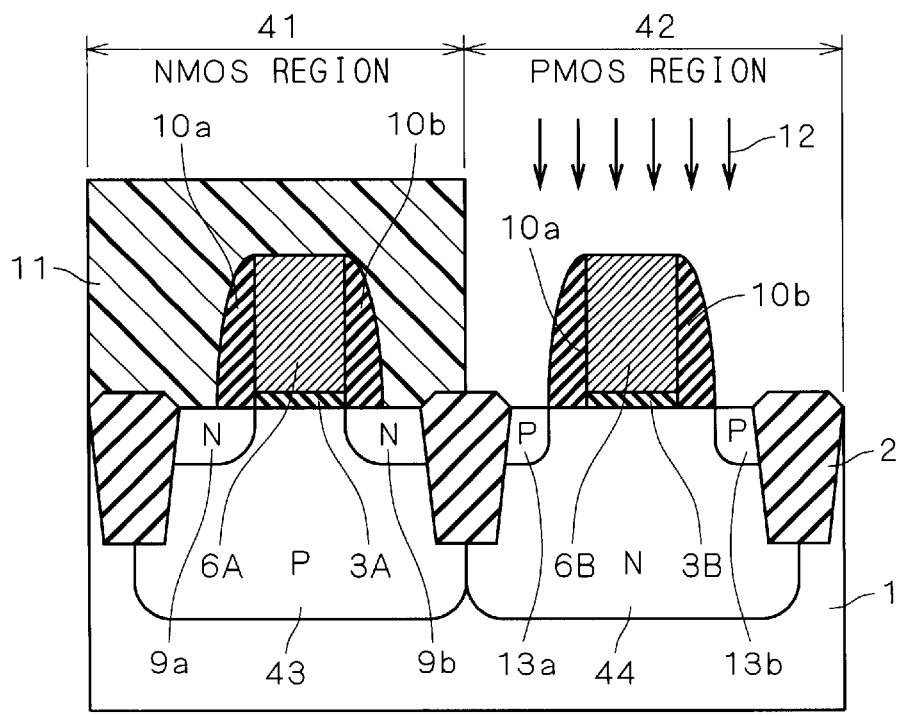

Subsequently, as shown in FIG. 6, resist 11 is formed on the entire surface and patterned so that the resist 11 remains only in the NMOS region 41, and P-type impurity ions 12 are implanted relatively deep from the surface of the silicon substrate 1 by using, as masks, the patterned resist 11 and the real gate electrode 6B and the boron-containing side walls 10a and 10b in the PMOS region 42, and a diffusion process is performed to obtain P-type diffusion regions 13a and 13b as the main source/drain regions of the PMOS transistor. The P-type diffusion regions 13a and 13b are formed to a formation depth equivalent to that of the N-type diffusion regions 9a and 9b.

Figure 7:
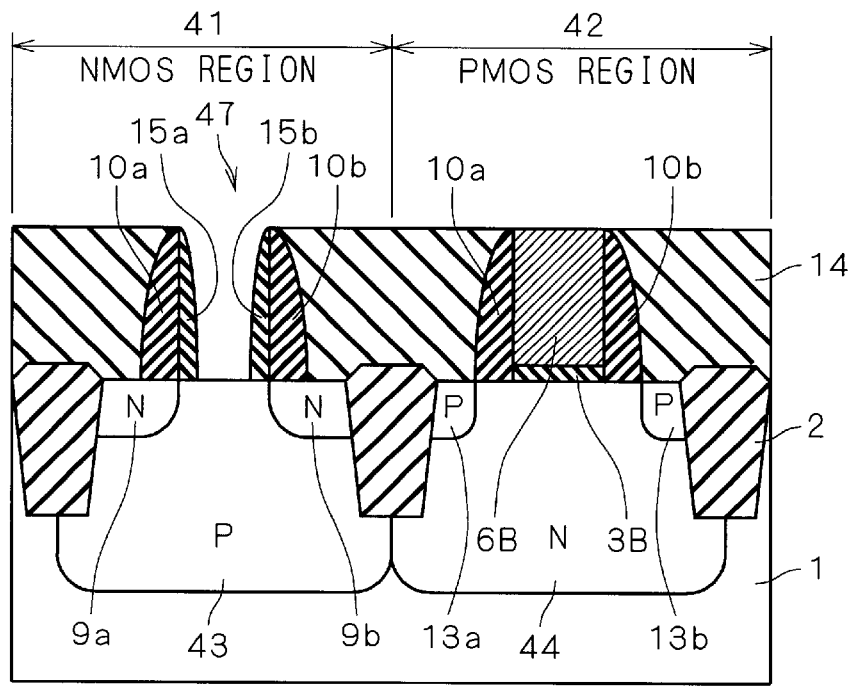

Next, as shown in FIG. 7, a silicon nitride film 14 is formed over the entire surface and smoothed by polishing such as CMP (Chemical Mechanical Polishing) so that the surface of the dummy gate electrode 6A is exposed. The dummy gate electrode 6A and the dummy gate oxide film 3A in the NMOS region 41 are then removed by using the silicon nitride film 14 and a protective film (not shown) formed on the real gate electrode 6B in the PMOS region 42 as masks, thus forming an opening 47.

Further, a side wall material containing about 1 to 20% of phosphorus, such as PSG (phospho-Silicate Glass), is deposited on the sides of the opening 47 to a film thickness of tens of nanometers to about 100 nm and etched back to form phosphorus-containing side walls 15a and 15b adjacent to the boron-containing side walls 10a and 10b, respectively.

In this process, when an NMOS transistor having a real gate length of 0.1 μm is manufactured with the dummy gate electrode 6A having a dummy gate length of 0.25 μm, for example, the phosphorus-containing side walls 15a and 15b are formed to a width of 0.075 μm (=(0.25−0.1)/2).

Figure 8:
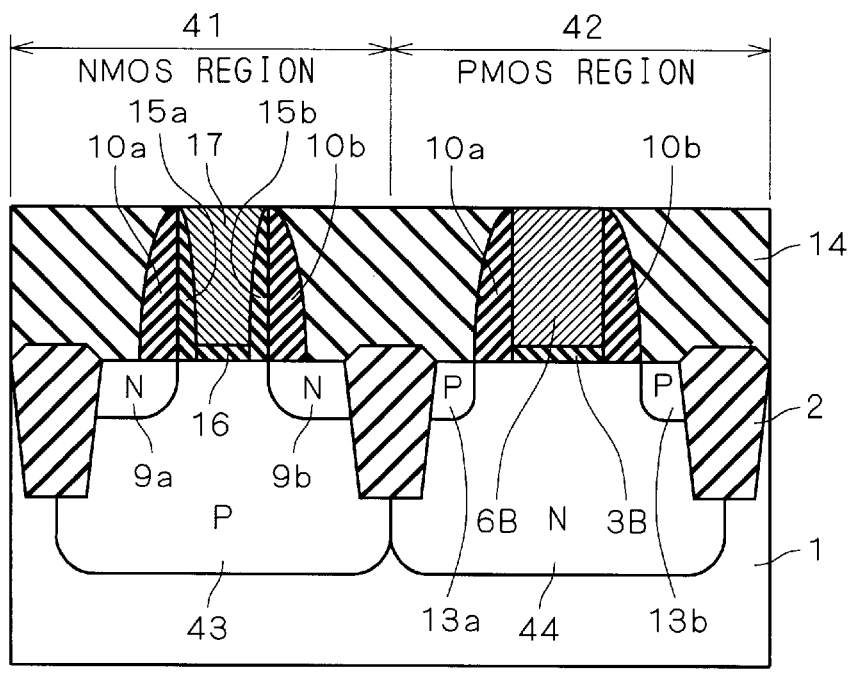

Subsequently, as shown in FIG. 8, a real gate oxide film 16 of silicon oxide film is formed on the P well region 43 in the opening 47 and a real gate electrode (interconnection) 17 of polysilicon is formed on the real gate oxide film 16, whereby the opening 47 is filled with the real gate oxide film 16 and the real gate electrode 17.

Figure 9:
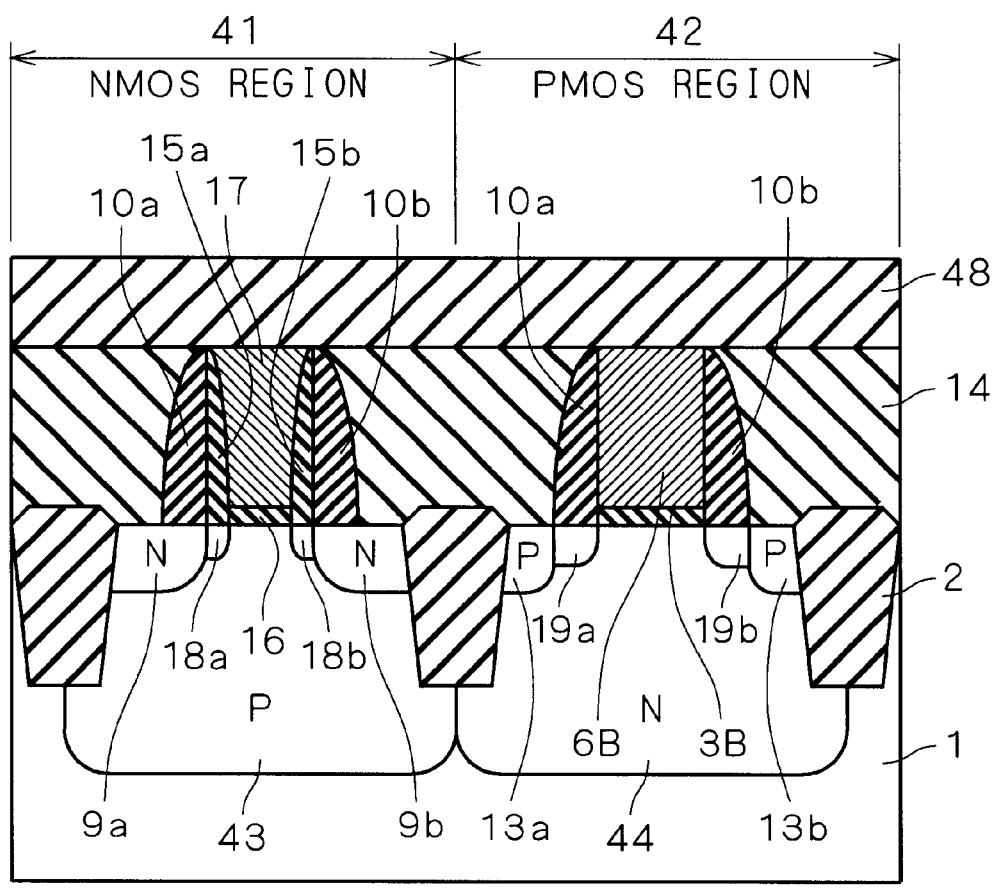

Next, as shown in FIG. 9, an interlayer insulating film 48 of silicon nitride film etc. is formed on the silicon nitride film 14. A thermal process applied during the formation of the interlayer insulating film 48 forms N-type extension regions 18a and 18b in the NMOS region 41 through a diffusion where phosphorus contained in the phosphorus-containing side walls 15a and 15b serves as the diffusion source, and it also forms P-type extension regions 19a and 19b in the PMOS region 42 through a diffusion where boron contained in the boron-containing side walls 10a and 10b serves as the diffusion source. The diffusion occurring from boron contained in the boron-containing side walls 10a and 10b in the NMOS region 41 can be neglected because it occurs in the N-type diffusion regions 9a and 9b.

In this way, the phosphorus-containing side walls 15a and 15b for formation of extensions in the NMOS region 41 are formed adjacent to the previously formed auxiliary boron-containing side walls 10a and 10b, so that the N-type extension regions 18a and 18b can be formed in precise position adjacent to the N-type diffusion regions 9a and 9b or the main source/drain regions.

Subsequently, the CMOS-structure semiconductor device having the NMOS and PMOS transistors is completed through existing processes such as interconnecting etc. The NMOS transistor fabricated in the NMOS region 41 is defined by the N-type diffusion regions 9 (9a and 9b), the N-type extension regions 18 (18a and 18b), the real gate oxide film 16 and the real gate electrode 17, and the PMOS transistor fabricated in the PMOS region 42 is defined by the P-type diffusion regions 13 (13a and 13b), the P-type extension regions 19 (19a and 19b), the real gate oxide film 3B, and the real gate electrode 6B. The N-type diffusion regions 9 and the N-type extension regions 18 form the source/drain regions of the NMOS transistor and the P-type diffusion regions 13 and the P-type extension regions 19 form the source/drain regions of the PMOS transistor.

Since the N-type extension regions 18 and the P-type extension regions 19 are formed by utilizing the thermal process for the formation of the interlayer insulating film 48, the N-type extension regions 18 and the P-type extension regions 19 can be formed at the same time without the need for adding a separate process for forming these extension regions.

A high-temperature, short-time processing at 900 to 1050° C. for 30 seconds or less by RTA (Rapid Thermal Annealing) etc. may be performed after the formation of the real gate electrode 17 shown in FIG. 8 to simultaneously activate the extension regions 18 and 19 and the main source/drain regions 9 and 13.

While this preferred embodiment uses a silicon oxide film as the gate insulating films, a silicon nitride film, nitrided oxide film, or high-dielectric-constant material such as $Ta_2O_5$ may be used as the gate insulating film material.

Further, for the material of the gate electrodes (interconnections), metal materials like tungsten or amorphous silicon may be used in place of polysilicon. The use of amorphous silicon can reduce dimensional variations in patterning as compared with a process using polysilicon. Silicon oxide film may be used in place of silicon nitride film as the interlayer insulating film.

Further, as shown in FIG. 10, instead of previously implanting an impurity for the channel region, P-type impurity ions 51 may be implanted from the opening 47 obtained by removing the dummy gate electrode 6A, at an angle of zero degree with respect to a normal of the formation surface of the silicon substrate 1, so as to form a channel region between the N-type diffusion regions 9a and 9b. Forming the channel region in this way after formation of the main source/drain regions reduces the effect of impurity redistribution caused by the thermal process in the formation of the main source/drain regions and suppresses the increase in parasitic resistance in the MOS transistor channel region.

The channel region can be precisely positioned since it is formed by ion implantation through the opening 47; the channel region can be formed without positional deviation since ions are implanted at 0°.

Furthermore, P-type pocket regions may be formed under the boron-containing side walls 10a and 10b by obliquely implanting P-type impurity ions through the opening 47 at an angle of 5 to 15 degrees in the direction toward the boron-containing side walls 10a and 10b.

In this way, in the MOS transistor manufacturing method of the first preferred embodiment, the extension regions are formed after formation of the main source/drain regions by utilizing a thermal process performed during formation of an interlayer insulating film etc. after formation of the side walls, where the impurity-containing side walls are used as the diffusion sources.

Accordingly, thermal processing applied during formation of the main source/drain regions does not affect the extension regions at all; since the effect of the thermal process for formation of the main source/drain regions is removed, it is possible to form extension regions with shallower formation depth (unction depth).

That is to say, MOS transistors having shallow PN junctions can be obtained by minimizing the effect of thermal processing which will contribute to the impurity diffusion when performed after the formation of the extension regions.

<Second Preferred Embodiment>

FIGS. 11 to 18 are sectional views showing a method for manufacturing MOS transistors having CMOS structure according to a second preferred embodiment of the present invention. The manufacturing method of the second preferred embodiment is now described referring to these diagrams.

Figure 11:
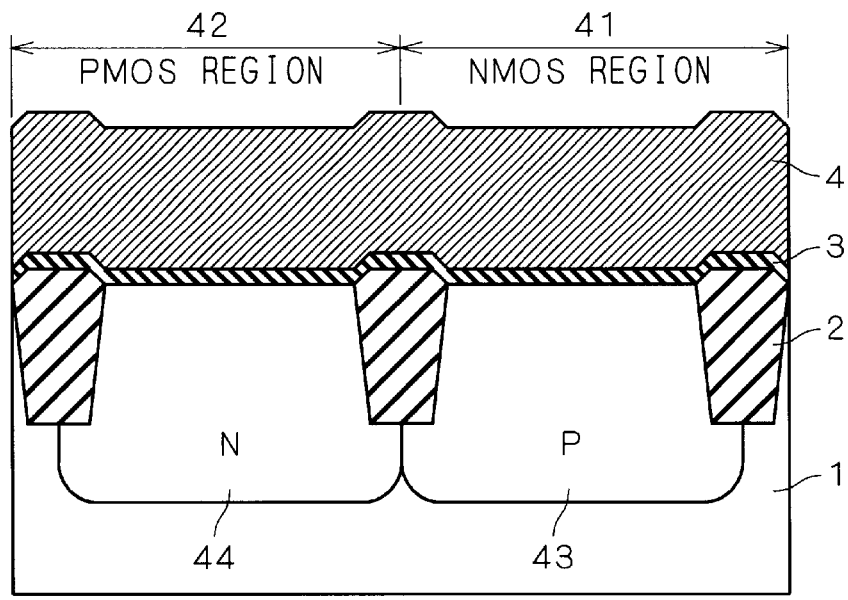

First, as shown in FIG. 11, element isolation regions 2 are selectively formed in the upper part of a silicon substrate 1. Next, a P well region 43 and an N well region 44 (both of which include a channel region) are formed by ion implantation etc. in the NMOS region 41 and the PMOS region 42, and a silicon oxide film 3 and a polysilicon layer 4 are sequentially deposited on the entire surface of the silicon substrate 1.

Figure 12:
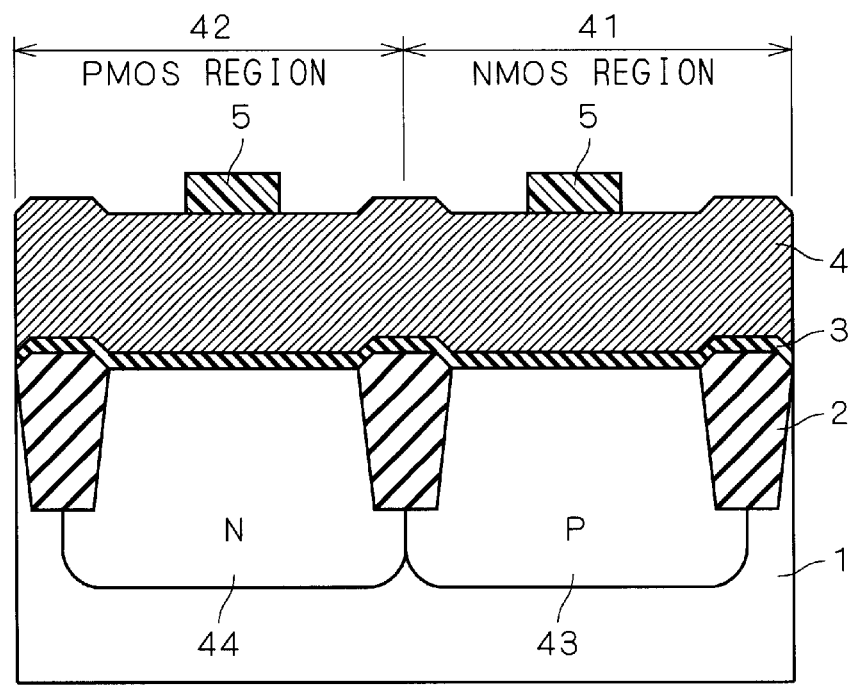

Next, as shown in FIG. 12, resist 5 is formed on the polysilicon layer 4 and patterned by photolithography.

Figure 13:
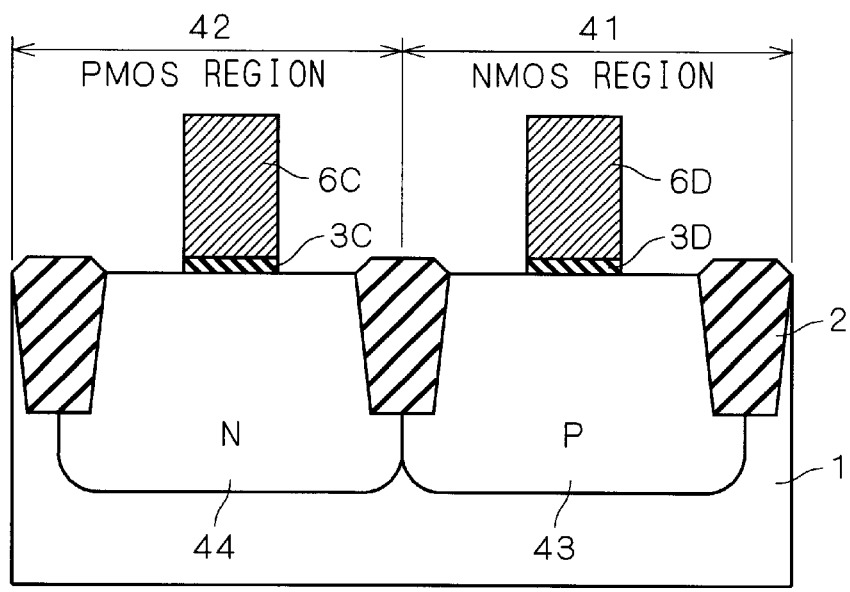

Then, as shown in FIG. 13, the polysilicon layer 4 and the silicon oxide film 3 are etched using the patterned resist 5 as a mask to obtain a dummy gate electrode portion composed of a dummy gate electrode (interconnection) 6C and a dummy gate oxide film 3C in the PMOS region 42 and a real gate electrode portion composed of a real gate interconnection 6D and a real gate oxide film 3D in the NMOS region 41.

Figure 14:
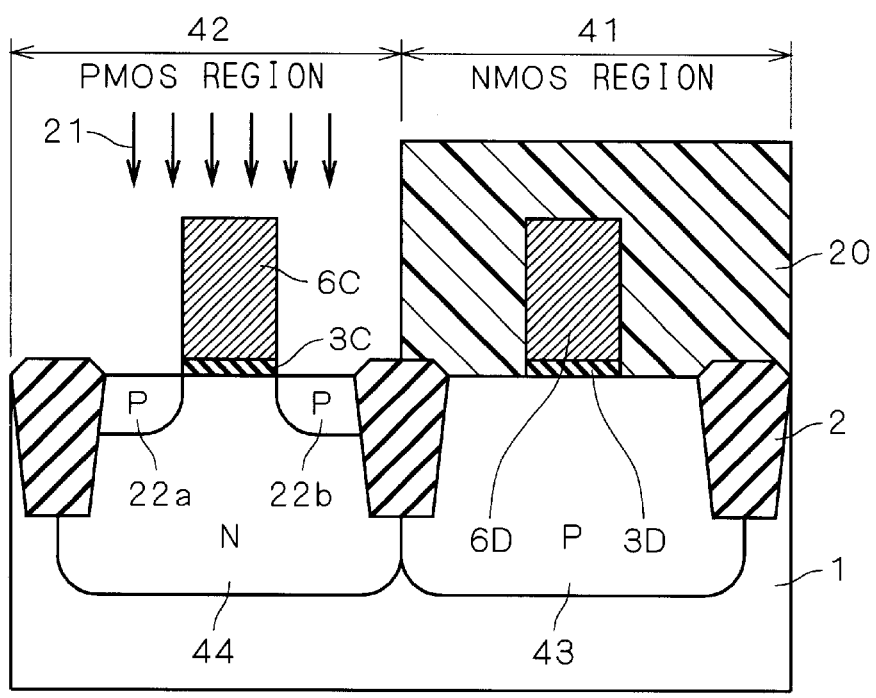

Subsequently, as shown in FIG. 14, resist 20 is formed on the entire surface and patterned so that the resist 20 remains only in the NMOS region 41 and P-type impurity ions 21 are implanted relatively deep from the surface of the silicon substrate 1 by using the patterned resist 20 and the dummy gate electrode 6C in the PMOS region 42 as masks, and a diffusion process is performed to form P-type diffusion regions 22.

Figure 15:
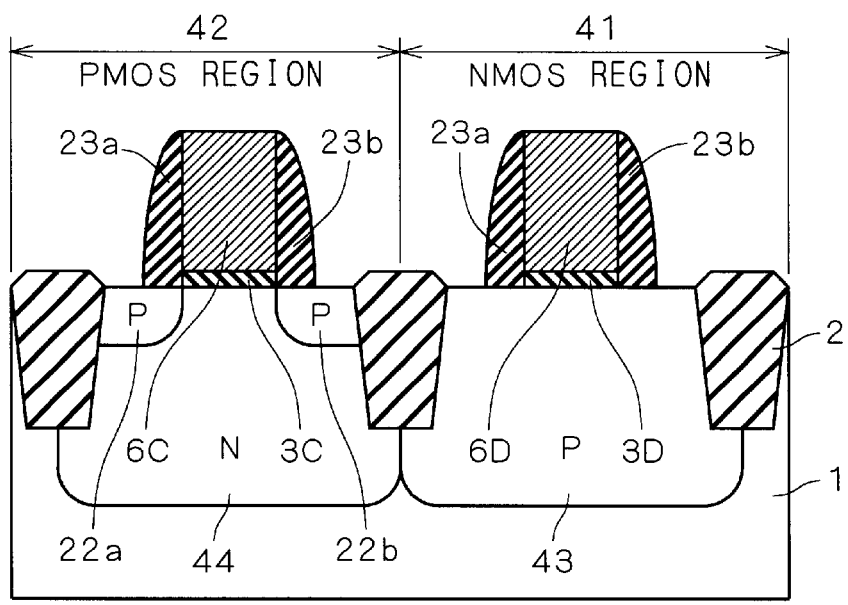

Next, as shown in FIG. 15, a side wall material containing about 1 to 20% of phosphorus, such as PSG, is deposited to a film thickness of tens of nanometers to about 100 nm and etched back to form phosphorus-containing side walls 23a and 23b on the sides of the dummy gate electrode portion (6C and 3C) and the real gate electrode portion (6D and 3D).

Figure 16:
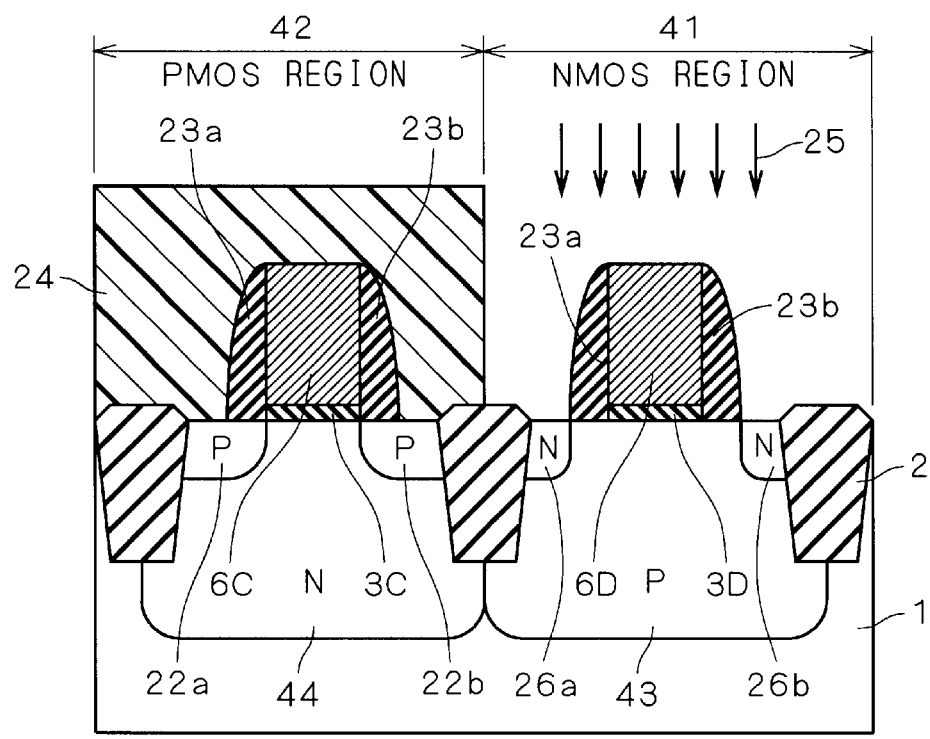

Subsequently, as shown in FIG. 16, resist 24 is formed on the entire surface and patterned so that the resist 24 remains only in the PMOS region 42, and N-type impurity ions 25 are implanted relatively deep from the surface of the silicon substrate 1 by using, as masks, the patterned resist 24 and the real gate interconnection 6D and the phosphorus-containing side walls 23a and 23b in the NMOS region 41, and a diffusion process is performed to obtain N-type diffusion regions 26. The N-type diffusion regions 26 are formed to a formation depth equivalent to that of the P-type diffusion regions 22.

Figure 17:
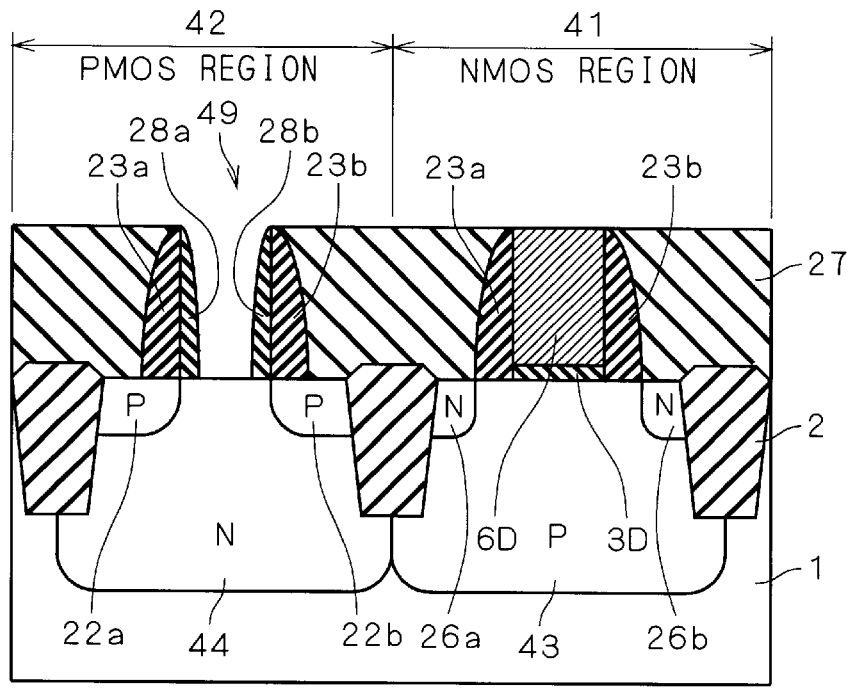

Next, as shown in FIG. 17, a silicon nitride film 27 is deposited over the entire surface and smoothed by polishing such as CMP so that the surface of the dummy gate electrode 6C is exposed. The dummy gate electrode 6C and the dummy gate oxide film 3C in the PMOS region 42 are removed by using the silicon nitride film 27 and a protective film (not shown) formed on the real gate interconnection 6D in the NMOS region 41 as masks, whereby an opening 49 is formed.

Further, a side wall material containing about 1 to 20% of boron, such as BSG, is deposited on the sides of the opening 49 to a film thickness of tens of nanometers to about 100 nm and etched back to form boron-containing side walls 28a and 28b adjacent to the phosphorus-containing side walls 23a and 23b, respectively.

In this process, when a PMOS transistor having a real gate length of 0.1 $\mu$m is manufactured with the dummy gate electrode 6C having a dummy gate length of 0.25 $\mu$m, for example, the boron-containing side walls 28a and 28b are formed to a width of 0.075 $\mu$m.

Figure 18:
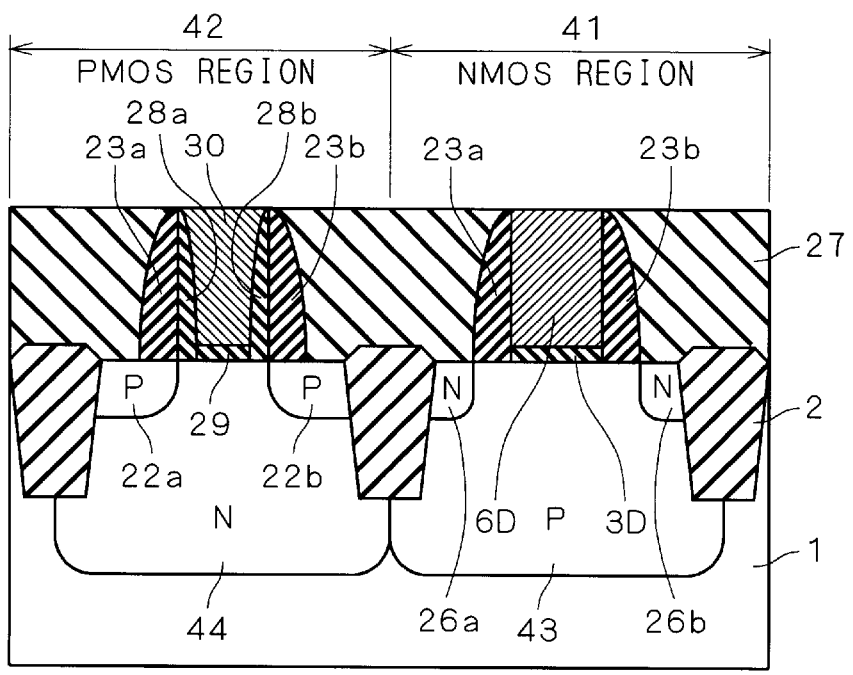
Figure 20:
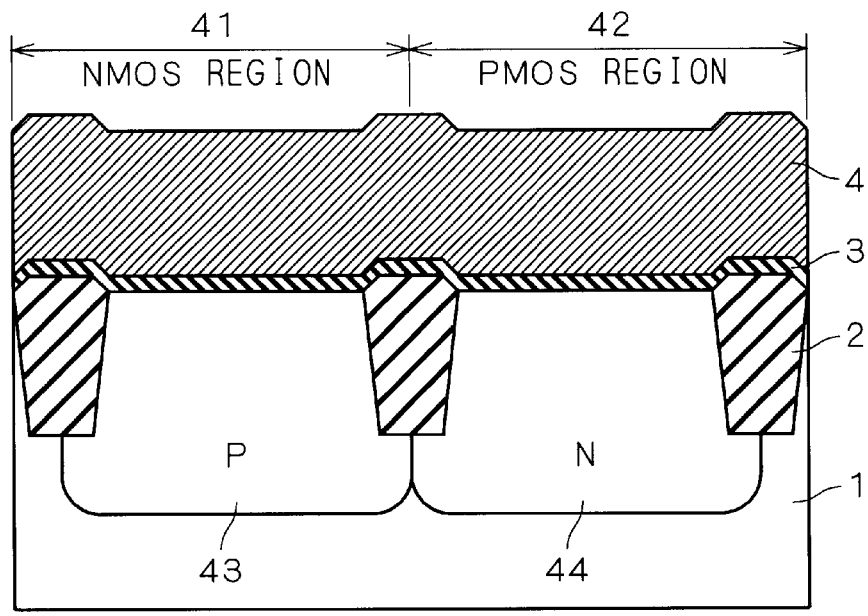
FIGS. 20 to 28 are sectional views showing an MOS transistor manufacturing method according to a third preferred embodiment of the present invention.
Figure 21:
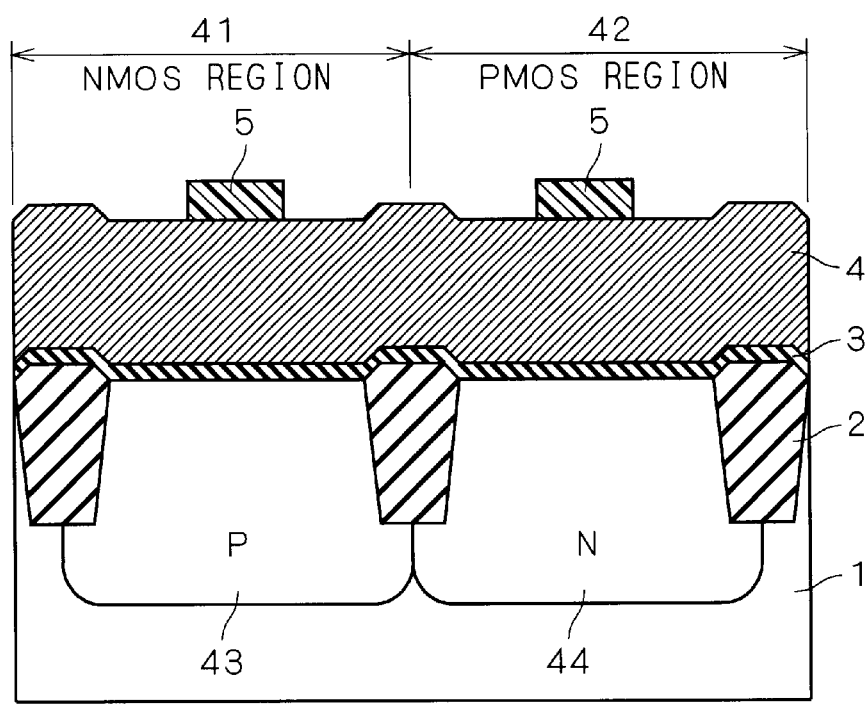
Figure 22:
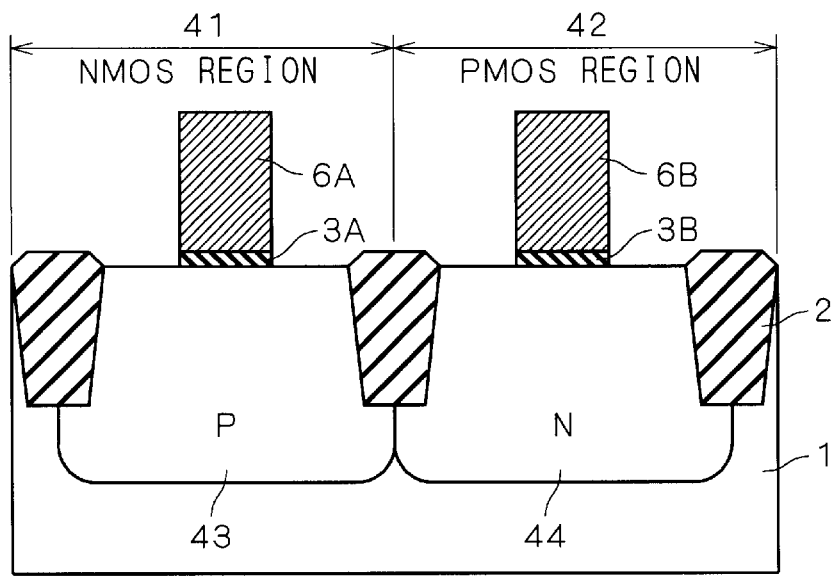
Figure 23:
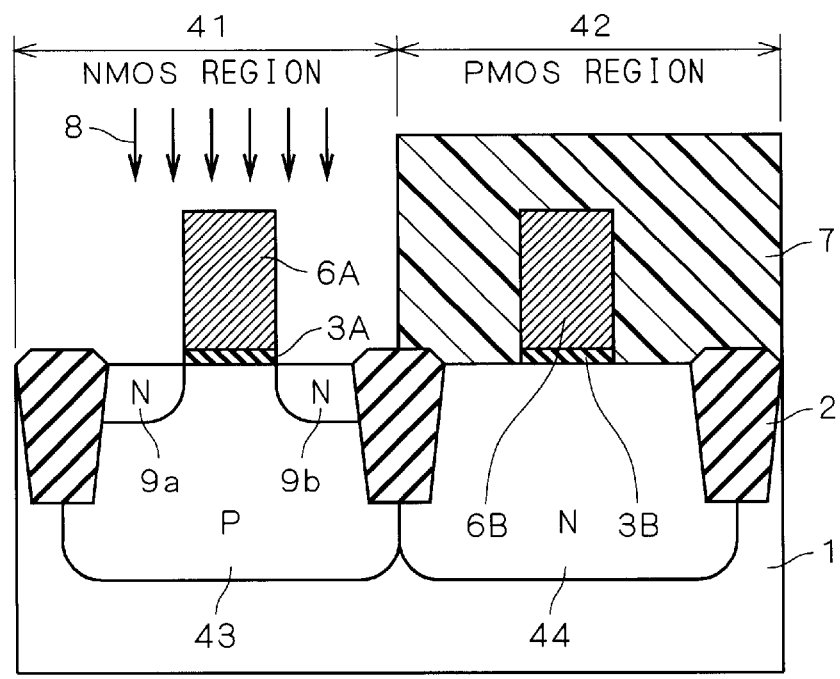
Figure 24:
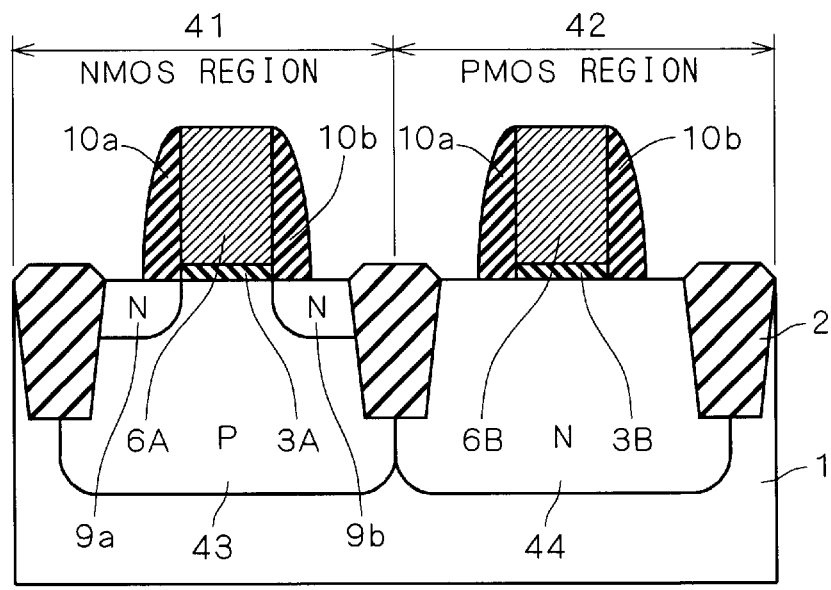
Figure 25:
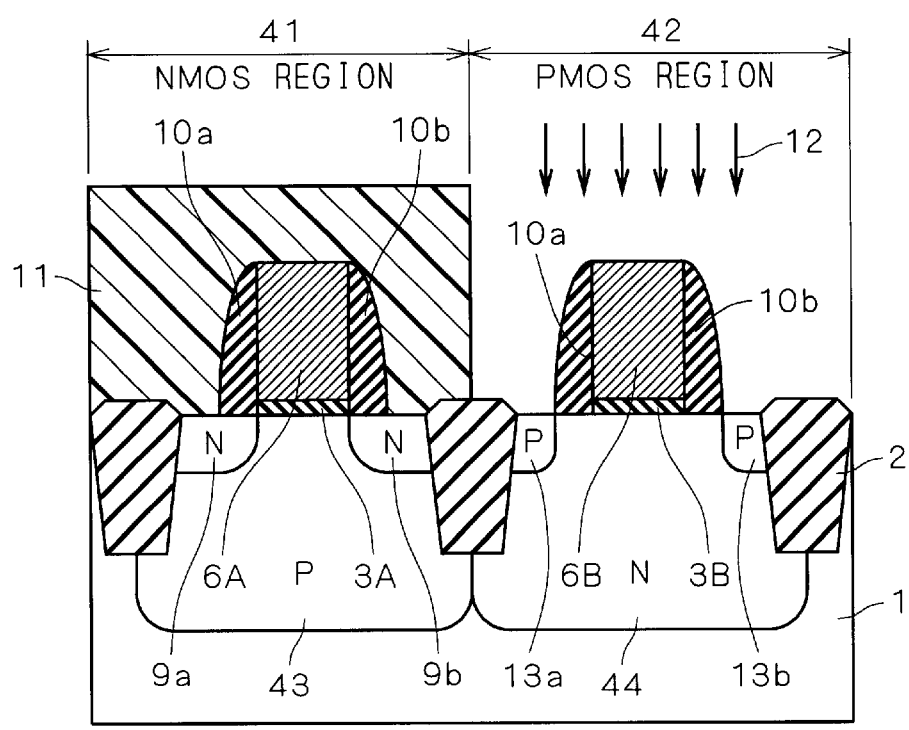

Subsequently, as shown in FIG. 18, a gate oxide film 29 of silicon oxide film is formed on the N well region 44 in the opening 49 and a real gate electrode (interconnection) 30 of polysilicon is formed on the gate oxide film 29, thereby filling the opening 49 with the gate oxide film 29 and the real gate electrode 30.

Next, as shown in FIG. 19, an interlayer insulating film 50 of silicon nitride film etc. is formed on the silicon nitride film 27. A thermal process applied during the formation of the interlayer insulating film 50 forms P-type extension regions 31a and 31b in the PMOS region 42 through a diffusion where boron contained in the boron-containing side walls 28a and 28b serves as the diffusion source, and it also forms N-type extension regions 32a and 32b in the NMOS region 41 through a diffusion where phosphorus contained in the phosphorus-containing side walls 23a and 23b serves as the diffusion source. The diffusion occurring from the phosphorus-containing side walls 23a and 23b in the PMOS region 42 can be neglected because it occurs in the P-type diffusion regions 22.

Subsequently, the CMOS-structure semiconductor device having the NMOS and PMOS transistors is completed through existing processes such as interconnecting etc. The NMOS transistor fabricated in the NMOS region 41 is defined by the N-type diffusion regions 26 (26a and 26b), the N-type extension regions 32 (32a and 32b), the real gate oxide film 3D and the real gate electrode 6D, and the PMOS transistor fabricated in the PMOS region 42 is defined by the P-type diffusion regions 22 (22a and 22b), the P-type extension regions 31 (31a and 31b), the real gate oxide film 29, and the real gate electrode 30. The N-type diffusion regions 26 and the N-type extension regions 32 form the source/drain regions of the NMOS transistor and the P-type diffusion regions 22 and the P-type extension regions 31 form the source/drain regions of the PMOS transistor.

As in the first preferred embodiment, a high-temperature, short-time processing by RTA etc. may be performed after the formation of the real gate electrode 30 shown in FIG. 18 to simultaneously activate the extension regions 31 and 32 and the main source/drain regions 22 and 26.

While the second preferred embodiment uses a silicon oxide film as the gate insulating films, a silicon nitride film, nitrided oxide film, or high-dielectric-constant material such as $Ta_2O_5$ may be used as the gate insulating film material, as in the first preferred embodiment.

Further, as in the first preferred embodiment, metal materials like tungsten etc. may be used in place of polysilicon as the material of the gate interconnections (electrodes). Also, silicon oxide film may be used in place of silicon nitride film as the interlayer insulating film.

Further, as in the first preferred embodiment, instead of previously implanting an impurity for the channel region, P-type impurity ions may be implanted at 0° through the opening 49 obtained by removing the dummy gate electrode 6C so as to form a channel region. Forming the channel region in this way suppresses the increase in parasitic resistance in the MOS transistor channel region and reduces the effect of impurity redistribution caused by thermal process.

In this way, in the MOS transistor manufacturing method of the second preferred embodiment, as in the first preferred embodiment, the extension regions are formed after formation of the main source/drain regions through a diffusion process where the impurities in the impurity-containing side walls are used as the diffusion source, by utilizing a thermal process performed during formation of an interlayer insulating film etc. after formation of the side walls. Accordingly, MOS transistors having shallower PN junctions can be obtained by minimizing the effect of thermal processing which will contribute to the impurity diffusion when performed after the formation of the extension regions.

<Third Preferred Embodiment>

FIGS. 20 to 27 are sectional views showing a method for manufacturing MOS transistors having CMOS structure according to a third preferred embodiment of the present invention.

The processes shown in FIGS. 20 to 25 are not described here since they are the same as those shown in FIGS. 1 to 6 in the first preferred embodiment. The manufacturing method of the third preferred embodiment will now be described referring to FIGS. 26 to 28.

Figure 26:
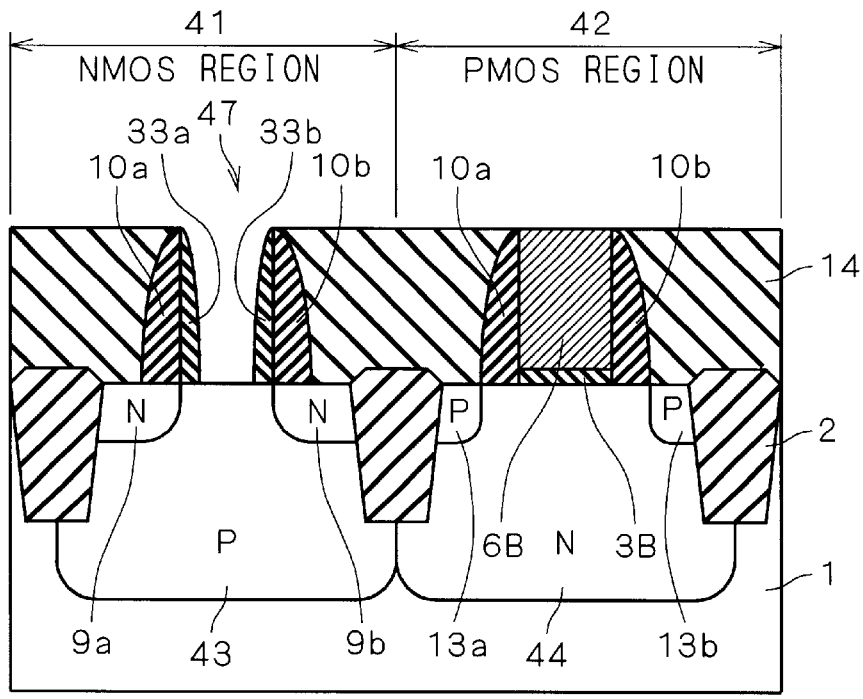

As shown in FIG. 26, an opening 47 is formed as in the process shown in FIG. 7 in the first preferred embodiment and a side wall material containing boron and arsenic, at about 1 to 20% each, is deposited on the sides of the opening 47. It is then etched back to form boron-and-arsenic-containing side walls 33a and 33b adjacent to the boron-containing side walls 10a and 10b.

Figure 27:
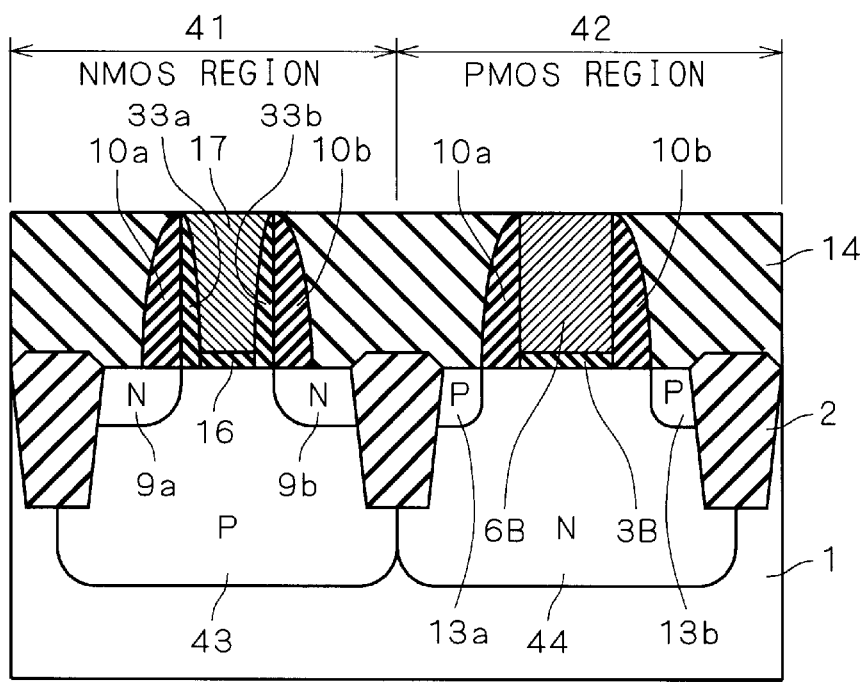

Subsequently, as shown in FIG. 27, a real gate oxide film 16 and a real gate electrode 17 are sequentially formed in the opening 47, thereby filling the opening 47 with the real gate oxide film 16 and the real gate electrode 17.

Figure 28:
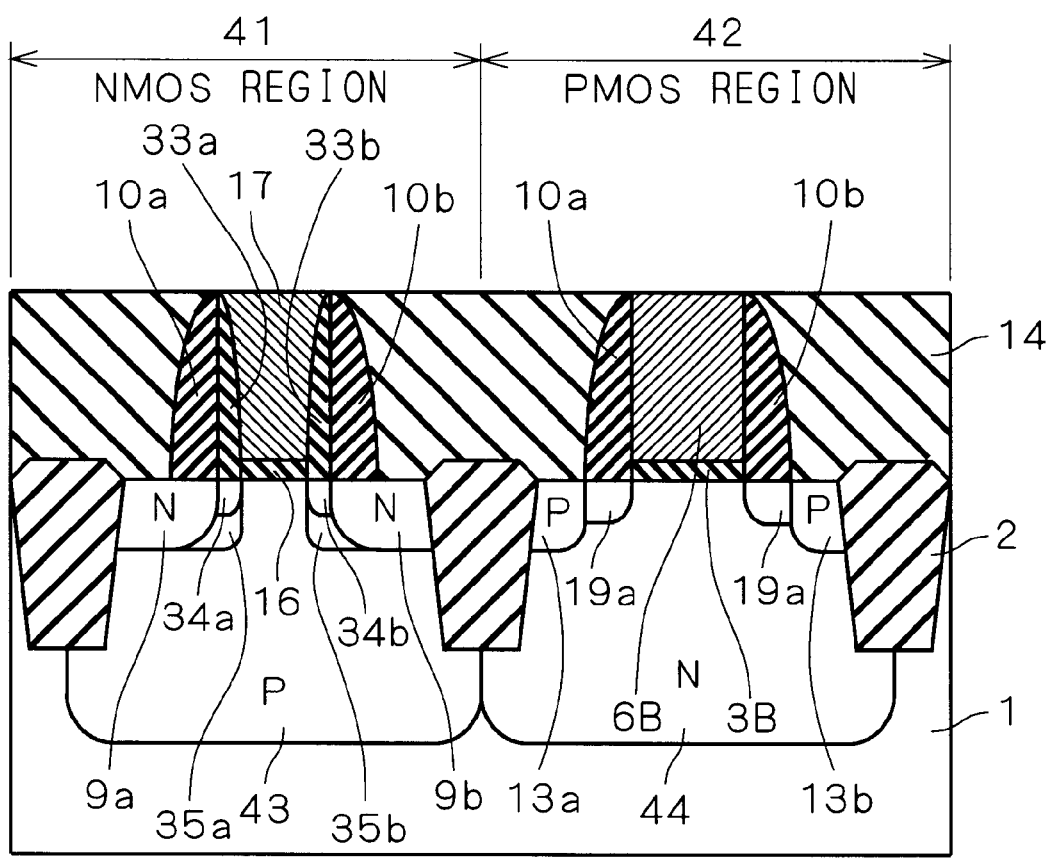

Next, as shown in FIG. 28, an interlayer insulating film (not shown) of silicon nitride film etc. is formed on the silicon nitride film 14. A thermal process applied during the formation of the interlayer insulating film forms N-type extension regions 34a and 34b and P-type pocket regions 35a and 35b in the NMOS region 41 through a diffusion where arsenic and boron in the boron-and-arsenic-containing side walls 33a and 33b serve as the diffusion source, and it also forms P-type extension regions 19a and 19b in the PMOS region 42 through a diffusion where boron contained in the boron-containing side walls 10a and 10b serves as the diffusion source.

The N-type extension regions 34 (34a and 34b) obtained by the diffusion of arsenic are formed in relatively shallow region from the surface of the silicon substrate 1 because of a difference in diffusion coefficient between boron and arsenic (that of boron is larger), and the P-type pocket regions 35 (35a and 35b) obtained by the diffusion of boron are formed in deeper region than the N-type extension regions 34. Thus the N-type extension regions 34 and the P-type pocket regions 35 are certainly separated. The P-type pocket regions 35 are regions where N-type impurity is compensated for by P-type impurity.

Subsequently, the CMOS-structure semiconductor device having the NMOS and PMOS transistors is completed through existing processes such as interconnecting etc. The NMOS transistor fabricated in the NMOS region 41 is defined by the N-type diffusion regions 9, the N-type extension regions 34, the P-type pocket regions 35, the real gate oxide film 16 and the real gate electrode 17, and the PMOS transistor fabricated in the PMOS region 42 is defined by the P-type diffusion regions 13, the P-type extension regions 19a and 19b, the real gate oxide film 3B, and the real gate electrode 6B. The N-type diffusion regions 9 and the N-type extension regions 34 form the source/drain regions of the NMOS transistor and the P-type diffusion regions 13 and the P-type extension regions 19 form the source/drain regions of the PMOS transistor.

The N-type extension regions 34, P-type pocket regions 35 and P-type extension regions 19 are formed by utilizing thermal processing applied during formation of the interlayer insulating film 48. Accordingly the N-type extension regions 34, P-type pocket regions 35 and P-type extension regions 19 can be simultaneously formed without the need to separately add a process for formation of these extension regions and pocket regions.

In this way, in the MOS transistor manufacturing method of the third preferred embodiment, as in those of the first and second preferred embodiments, the extension regions are formed after formation of the main source/drain regions through a diffusion process where the impurities in the impurity-containing side walls are used as the diffusion sources, by utilizing a thermal process performed during formation of an interlayer insulating film etc. after formation of the side walls. Accordingly, MOS transistors having shallow PN junctions can be obtained by minimizing the effect of thermal processing which will contribute to the impurity diffusion when performed after the formation of the extension regions.

Furthermore, the MOS transistor manufacturing method of the third preferred embodiment uses, as the diffusion source, the impurity-containing side walls which contain two kinds of impurities having different conductivity types and different diffusion coefficients, so that the pocket regions can be formed simultaneously in the formation of the extension regions of the NMOS transistor.

<Fourth Preferred Embodiment>

FIGS. 29 to 36 are sectional views showing a method for manufacturing MOS transistors having CMOS structure according to a fourth preferred embodiment of the invention. The manufacturing method of the fourth preferred embodiment is now described referring to these diagrams.

Figure 29:
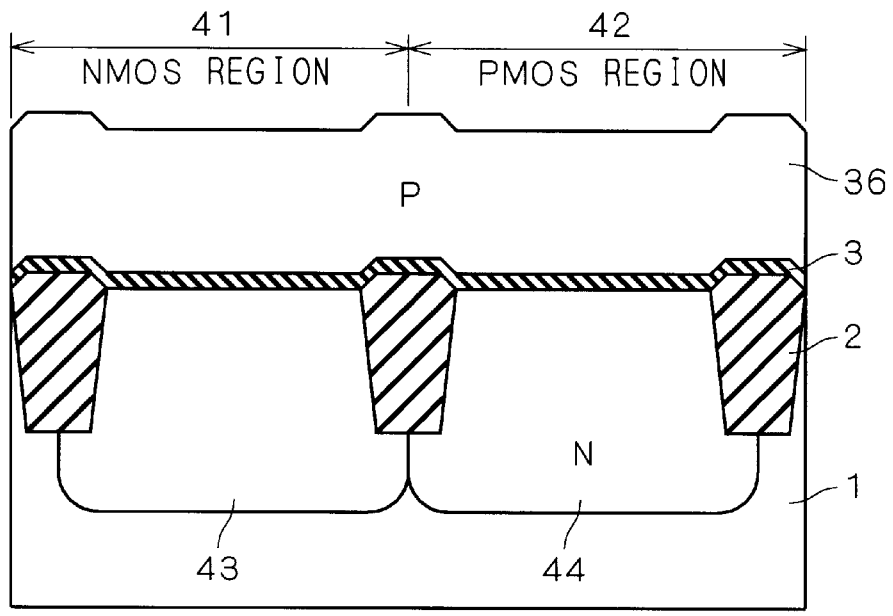
FIGS. 29 to 37 are sectional views showing an MOS transistor manufacturing method according to a fourth preferred embodiment of the present invention.

First, as shown in FIG. 29, element isolation regions 2 are selectively formed in the upper part of the silicon substrate 1 and a P well region 43 and an N well region 44 are formed by ion implantation etc. in the NMOS region 41 and the PMOS region 42, respectively. A silicon oxide film 3 and a P-type polysilicon layer 36 are then sequentially deposited on the entire surface of the silicon substrate 1.

Figure 30:
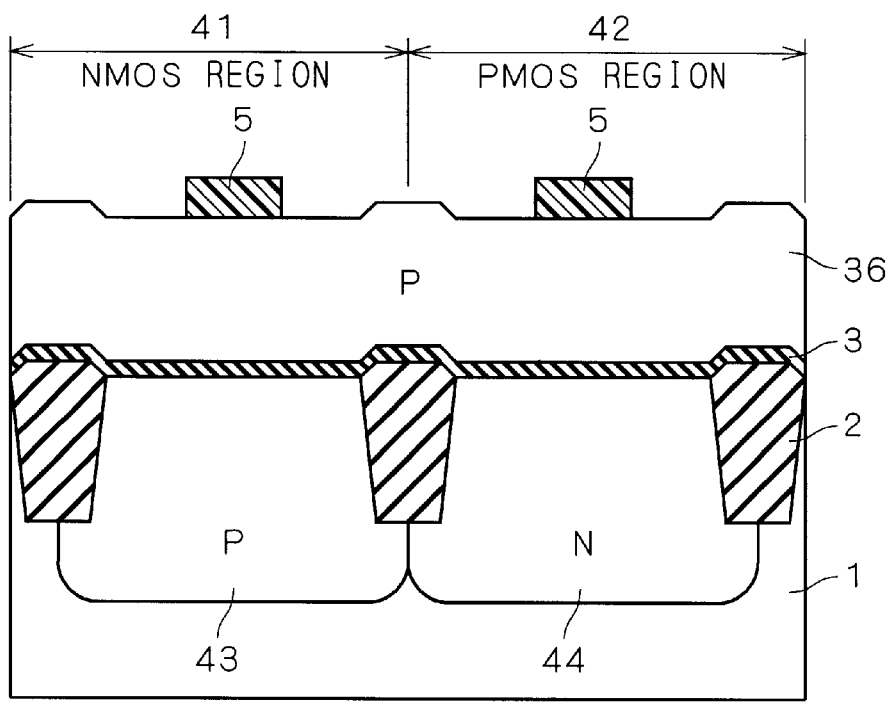

Next, as shown in FIG. 30, resist 5 is formed on the P-type polysilicon layer 36 and patterned by photolithography.

Figure 31:
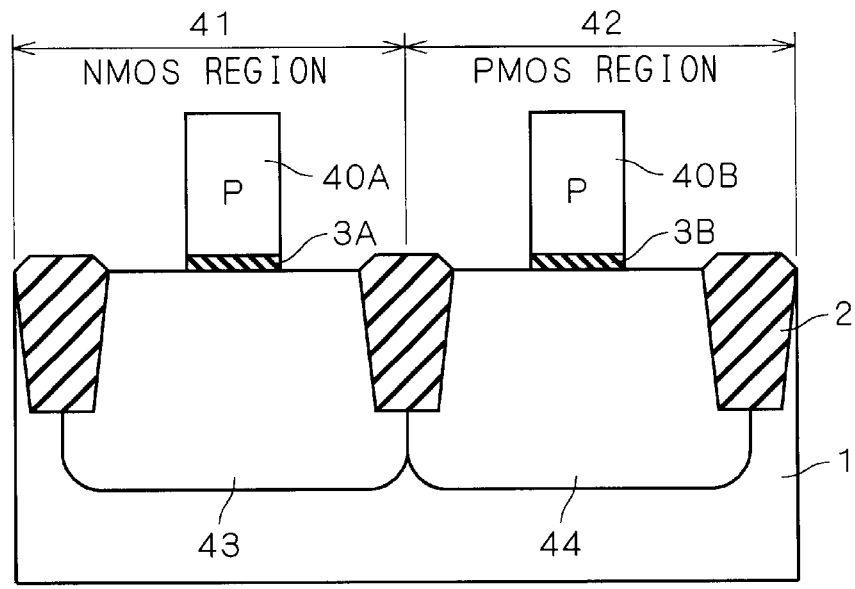
Figure 32:
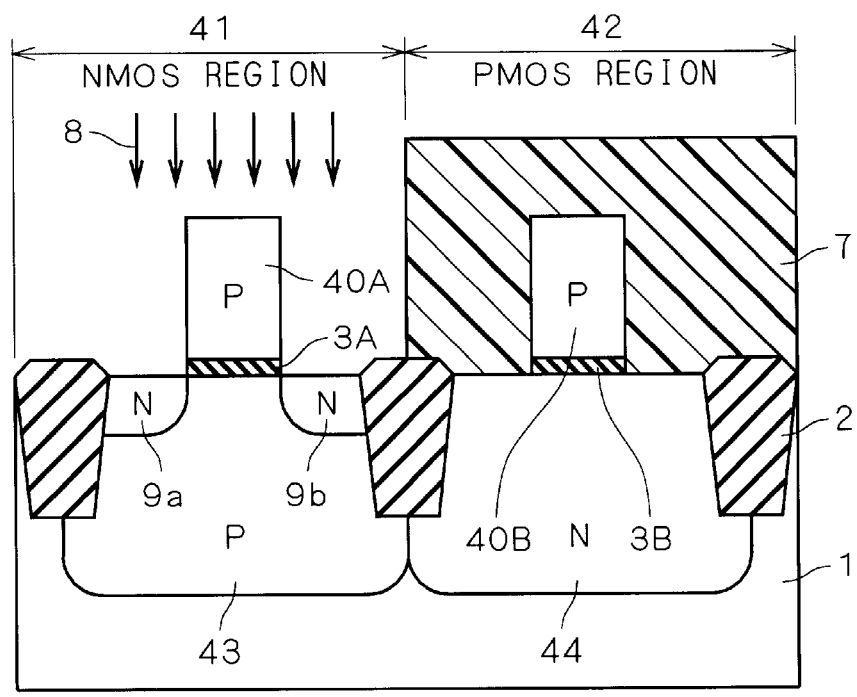
Figure 33:
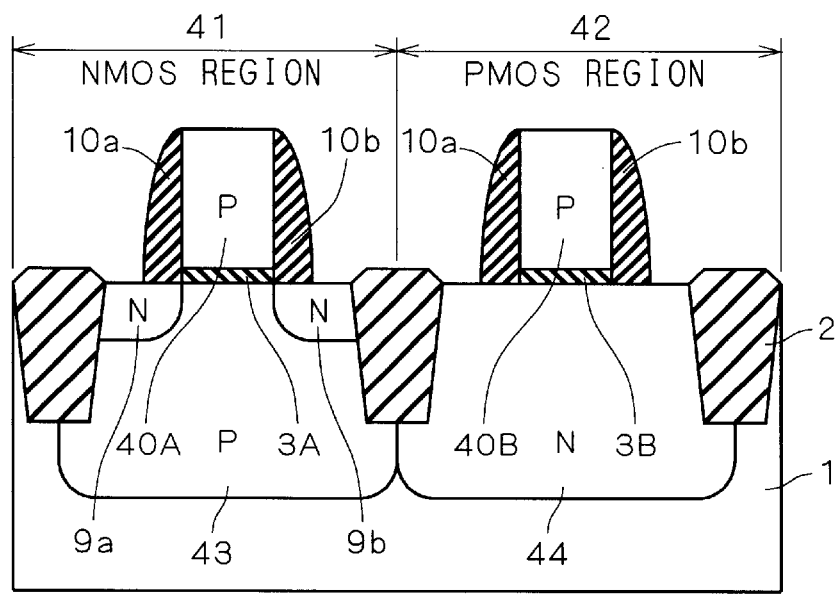
Figure 34:
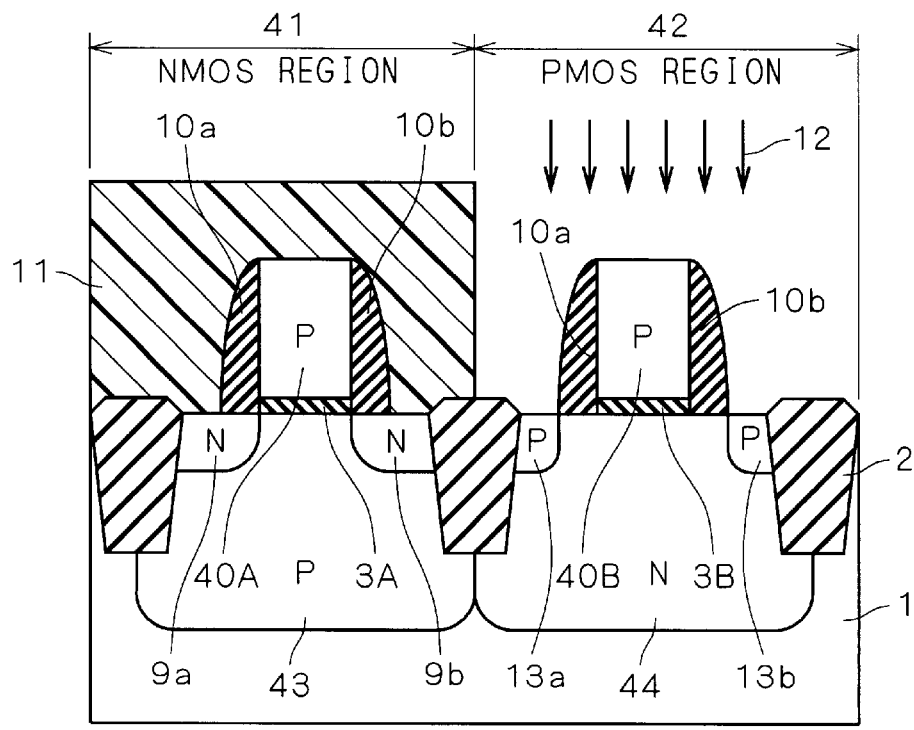

Subsequently, as shown in FIG. 31, the P-type polysilicon layer 36 and the silicon oxide film 3 are etched using the patterned resist 5 as a mask to obtain a dummy gate portion composed of a dummy gate electrode (interconnection) 40A and a dummy gate oxide film 3A in the NMOS region 41 and a real gate electrode portion composed of a real gate electrode (interconnection) 40B and a real gate oxide film 3B in the PMOS region 42.

Figure 35:
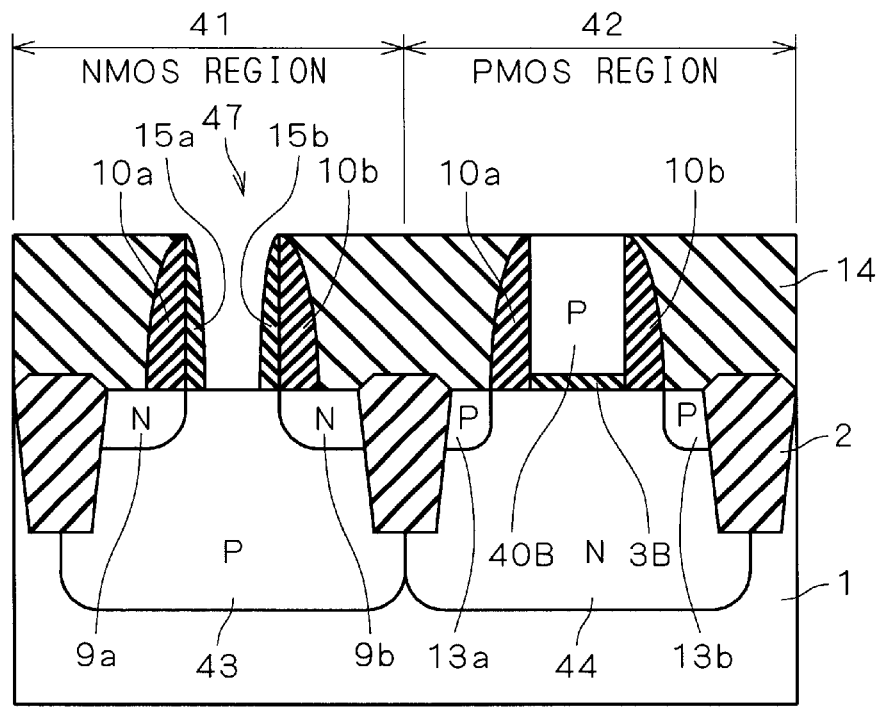

After that, the processes shown in FIGS. 32 to 35 are performed in the same way as those shown in FIGS. 4 to 7 in the first preferred embodiment, whereby the structure shown in FIG. 35 is obtained.

Figure 36:
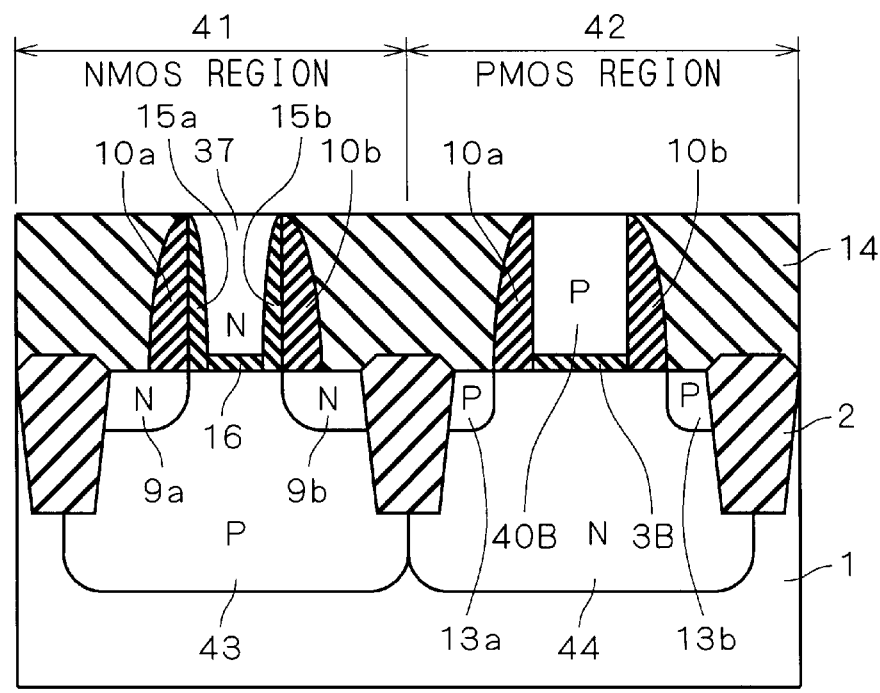

Next, as shown in FIG. 36, a real gate oxide film 16 and a real gate electrode 37 of N-type polysilicon are sequentially formed in the opening 47, thus filling the opening 47 with the real gate oxide film 16 and the real gate electrode 37.

Figure 37:
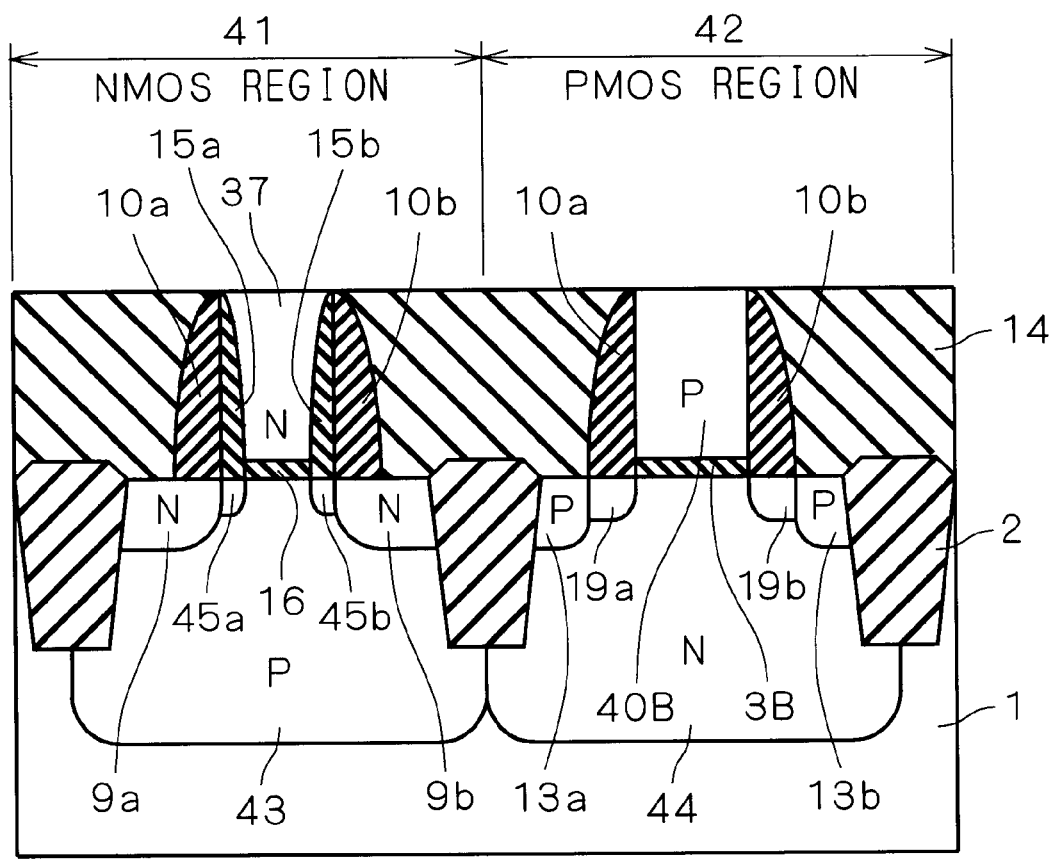

Next, as shown in FIG. 37, an interlayer insulating film (not shown) of silicon nitride film etc. is formed on the silicon nitride film 14. A thermal process applied during the formation of the interlayer insulating film forms N-type extension regions 45a and 45b in the NMOS region 41 through a diffusion where phosphorus contained in the phosphorus-containing side walls 15a and 15b serves as the diffusion source, and it also forms P-type extension regions 19a and 19b in the PMOS region 42 through a diffusion where boron contained in the boron-containing side walls 10a and 10b serves as the diffusion source.

Subsequently, the CMOS-structure semiconductor device having the NMOS and PMOS transistors is completed through existing processes such as interconnecting etc. The NMOS transistor fabricated in the NMOS region 41 is defined by the N-type diffusion regions 9, the N-type extension regions 18, the real gate oxide film 16 and the real gate electrode 37, and the PMOS transistor fabricated in the PMOS region 42 is defined by the P-type diffusion regions 13, the P-type extension regions 19, the real gate oxide film 3B, and the real gate electrode 40B.

In this way, in the MOS transistor manufacturing method of the fourth preferred embodiment, as in those of the first to third preferred embodiments, the extension regions are formed after formation of the main source/drain regions through a diffusion process where the impurities in the impurity-containing side walls are used as the diffusion source, by utilizing a thermal process performed during formation of an interlayer insulating film etc. after formation of the side walls. Accordingly, MOS transistors having shallow PN junctions can be obtained by minimizing the effect of thermal processing which will contribute to the impurity diffusion when performed after the formation of the extension regions.

Furthermore, in the MOS transistor manufacturing method of the fourth preferred embodiment, the gate electrodes of the NMOS transistor and the PMOS transistor (the real gate electrode 37 and the real gate electrode 40B) are formed of polysilicon of their respective conductivity types.

Accordingly, it is possible to form gate electrodes with work functions adapted to their respective conductivity types, and the transistors can be designed easily and the controllability is enhanced.

<Fifth Preferred Embodiment>

FIGS. 38 to 45 are sectional views showing a method for manufacturing MOS transistors having CMOS structure according to a fifth preferred embodiment of the invention. The manufacturing method of the fifth preferred embodiment is now described referring to these diagrams.

Figure 38:
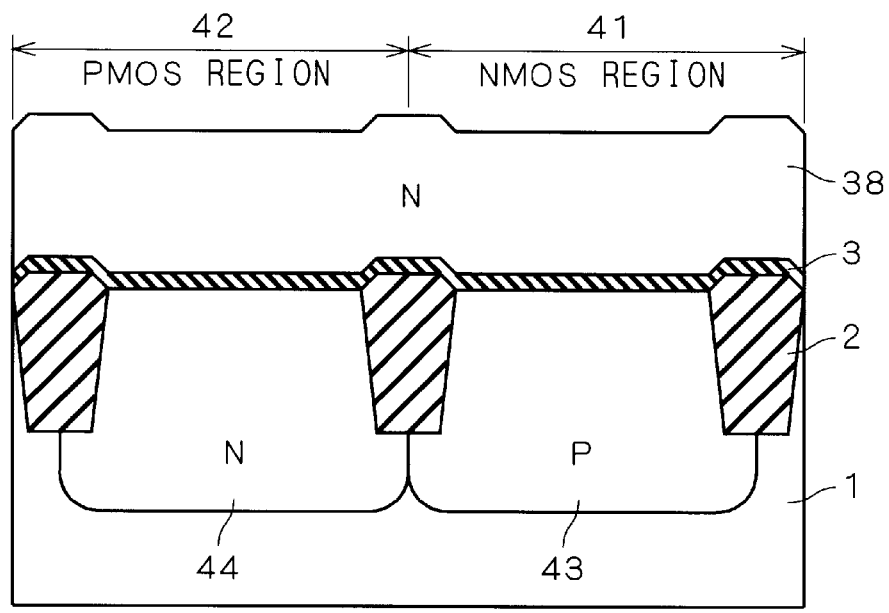

First, as shown in FIG. 38, element isolation regions 2 are selectively formed in the upper part of the silicon substrate 1 and a P well region 43 and an N well region 44 are formed by ion implantation etc. in the NMOS region 41 and the PMOS region 42, respectively. A silicon oxide film 3 and an N-type polysilicon layer 38 are then sequentially deposited on the entire surface of the silicon substrate 1.

Figure 39:
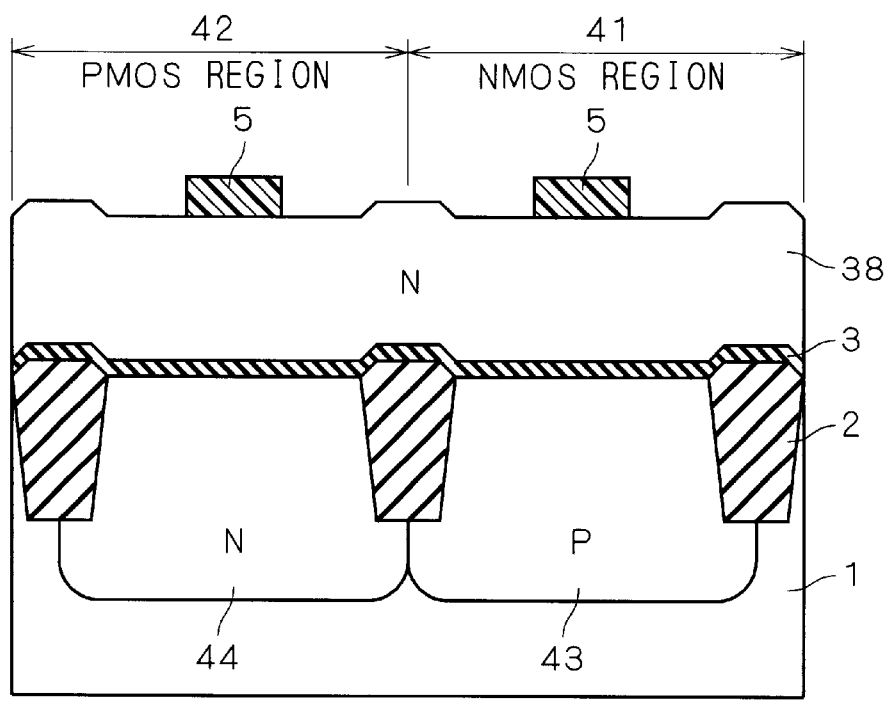

Next, as shown in FIG. 39, resist 5 is formed on the N-type polysilicon layer 38 and patterned by photolithography.

Figure 40:
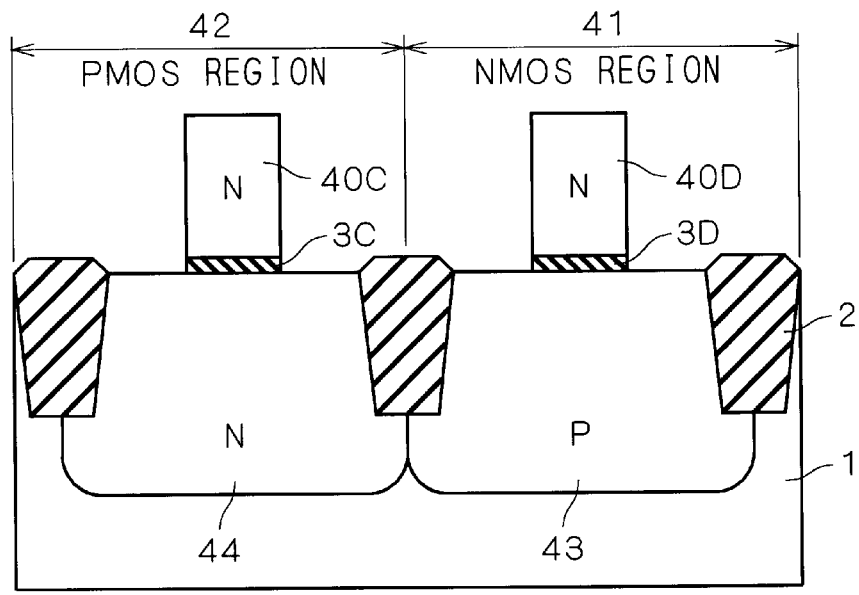
Figure 41:
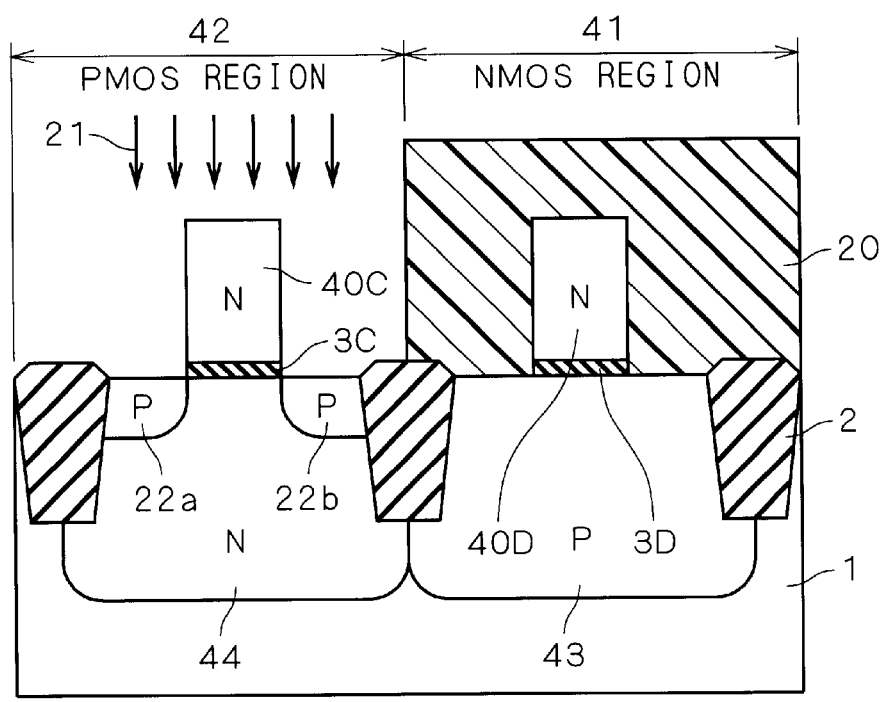

Subsequently, as shown in FIG. 40, the N-type polysilicon layer 38 and the silicon oxide film 3 are etched using the patterned resist 5 as a mask to obtain a dummy gate electrode portion composed of a dummy gate electrode (interconnection) 40C and a dummy gate oxide film 3C in the PMOS region 42 and a real gate electrode portion composed of a real gate electrode 40D and a real gate oxide film 3D in the NMOS region 41.

After that, the processes shown in FIGS. 41 to 44 are performed in the same way as those shown in FIGS. 14 to 17 in the second preferred embodiment, whereby the structure shown in FIG. 44 is obtained.

Next, as shown in FIG. 45, a gate oxide film 29 and a real gate electrode (interconnection) 39 of P-type polysilicon are sequentially formed in the opening 49, thus filling the opening 49 with the gate oxide film 29 and the real gate electrode 39.

Figure 46:
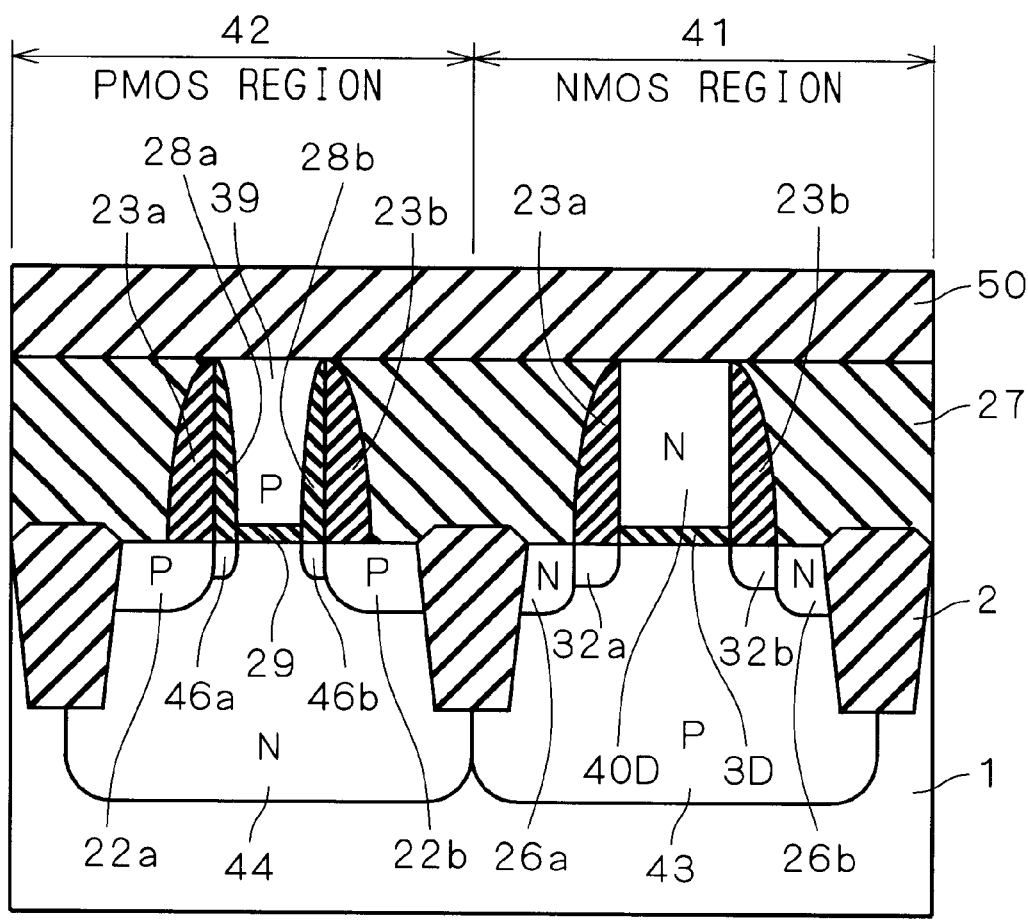
Figure 47:
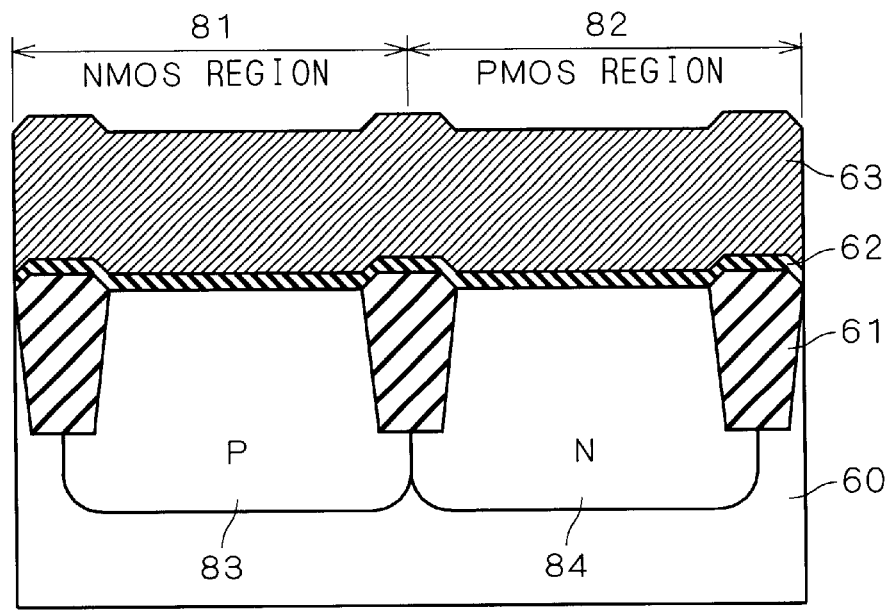
Figure 48:
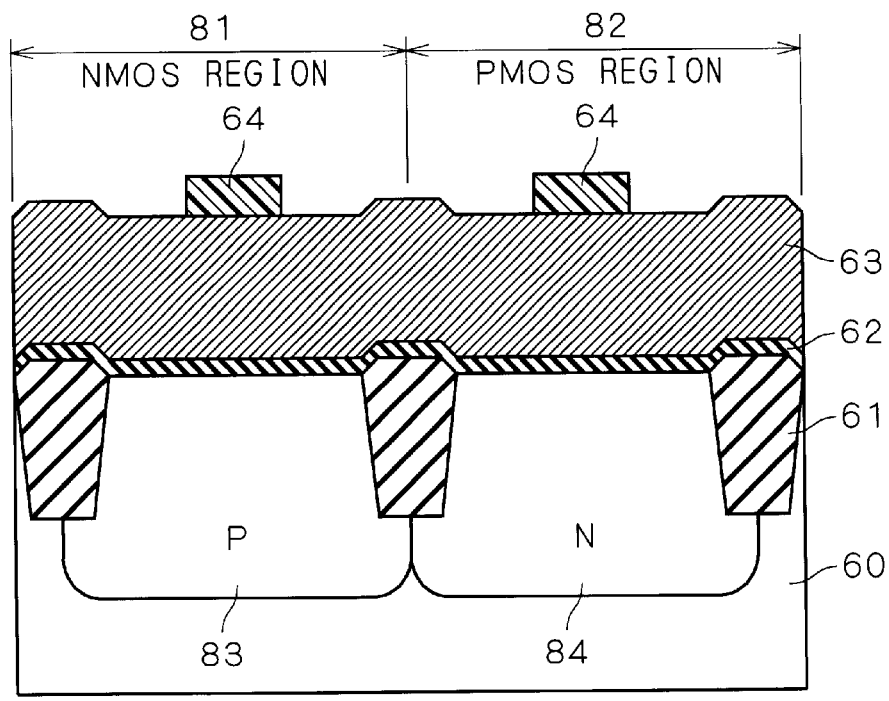
Figure 49:
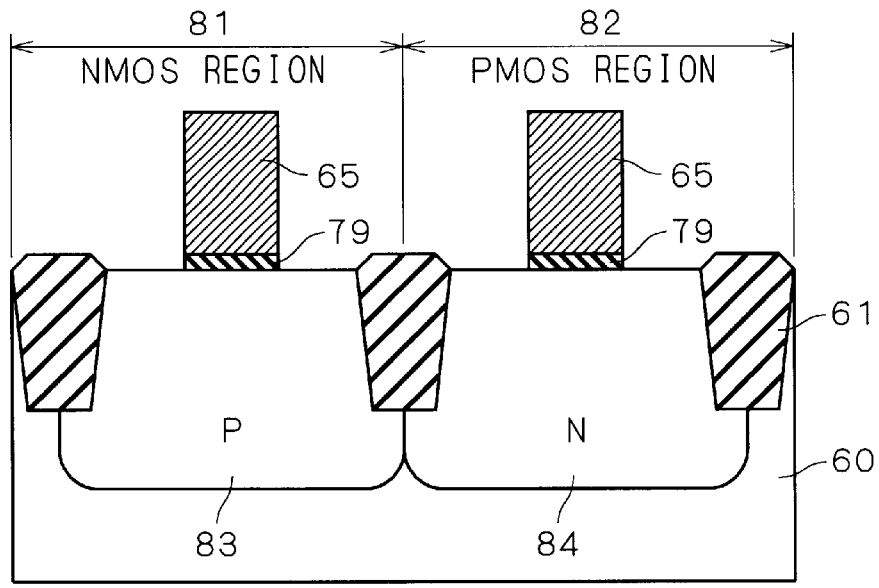
Figure 50:
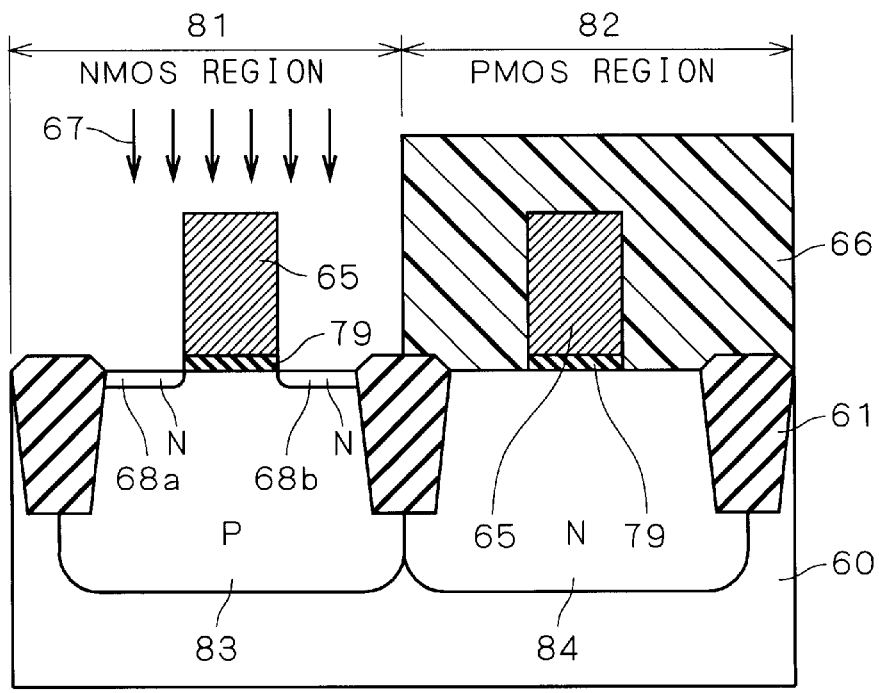
Figure 51:
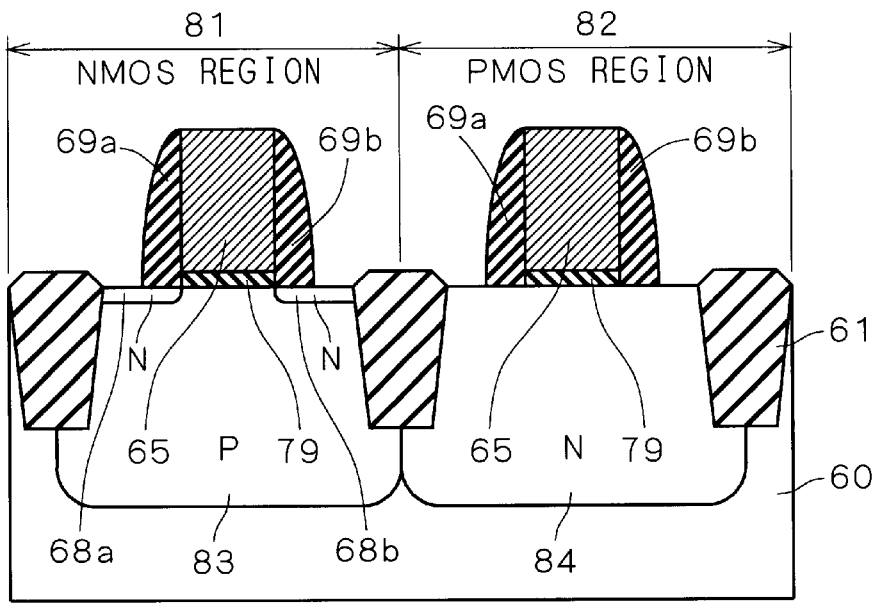
Figure 52:
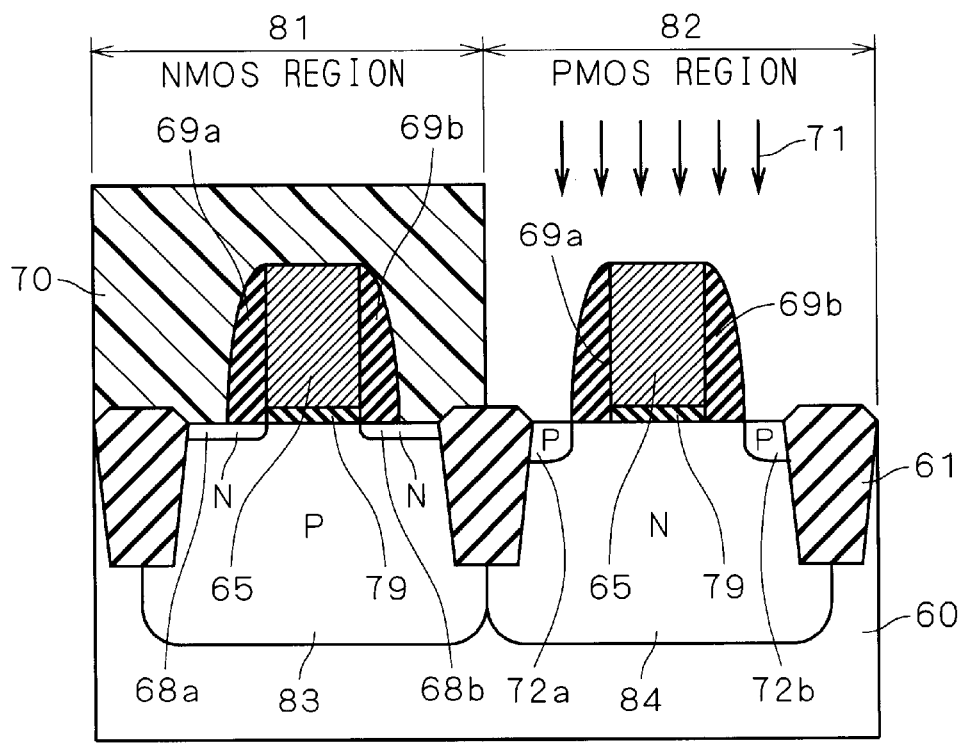

Next, as shown in FIG. 46, an interlayer insulating film 50 of silicon nitride film etc. is formed on the silicon nitride film 27. A thermal process applied during the formation of the interlayer insulating film 50 forms P-type extension regions 46a and 46b in the PMOS region 42 through a diffusion where boron contained in the boron-containing side walls 28a and 28b serves as the diffusion source, and it also forms N-type extension regions 32a and 32b in the NMOS region 41 through a diffusion where phosphorus contained in the phosphorus-containing side walls 23a and 23b serves as the diffusion source.

Subsequently, the CMOS-structure semiconductor device having the NMOS and PMOS transistors is completed through existing processes such as interconnecting etc. The NMOS transistor fabricated in the NMOS region 41 is defined by the N-type diffusion regions 26, the N-type extension regions 32, the real gate oxide film 3D and the real gate electrode 40D, and the PMOS transistor fabricated in the PMOS region 42 is defined by the P-type diffusion regions 22, the P-type extension regions 31, the real gate oxide film 29, and the real gate electrode 39. The N-type diffusion regions 26 and the N-type extension regions 32 form the source/drain regions of the NMOS transistor and the P-type diffusion regions 22 and the P-type extension regions 31 form the source/drain regions of the PMOS transistor.

In this way, in the MOS transistor manufacturing method of the fifth preferred embodiment, as in the first to fourth preferred embodiments, the extension regions are formed after formation of the main source/drain regions, through a diffusion process where the impurities in the impurity-containing side walls are used as the diffusion source, by utilizing a thermal process performed during formation of an interlayer insulating film etc. after formation of the side walls. Accordingly, MOS transistors having shallow PN junctions can be obtained by minimizing the effect of thermal processing which will contribute to impurity diffusion when performed after the formation of the extension regions.

Furthermore, in the MOS transistor manufacturing method of the fifth preferred embodiment, as in the fourth preferred embodiment, the gate electrodes of the NMOS transistor and the PMOS transistor are formed of polysilicon of their respective conductivity types. Accordingly, it is possible to form gate electrodes with work functions adapted to their respective conductivity types, and transistors can be designed easily and the controllability is enhanced.

While the invention has been described in detail, the foregoing description is in all aspects illustrative and not restrictive. It is understood that numerous other modifications and variations can be devised without departing from the scope of the invention.

What is claimed is:

1. A semiconductor device having an insulated-gate transistor of a first conductivity type, said semiconductor device comprising:

a semiconductor substrate having a predetermined semiconductor region of a second conductivity type in its surface;

a gate insulating film selectively formed on said predetermined semiconductor region, the surface of said predetermined semiconductor region under said gate insulating film being defined as a channel region;

a gate electrode formed on said gate insulating film;

first and second extension-forming side walls formed on sides of said gate electrode and containing an extension-forming impurity of the first conductivity type;

first and second auxiliary side walls adjacent respectively to said first and second extension-forming side walls such that the first and second extension-forming side walls are disposed between the sides of the gate elect rode and said first and second auxiliary side walls; and first and second source/drain regions separated by said channel region in the surface of said predetermined semiconductor region, wherein said gate insulating film, said gate electrode and said first and second source/drain regions define said transistor, and said source/drain regions include first and second extension regions which are shallower than other regions and are formed under said first and second extension-forming side walls.

2. The semiconductor device according to claim 1, wherein said first and second extension-forming side walls further include a pocket-forming impurity of the second conductivity type, and said source/drain regions further include first and second pocket regions of the second conductivity type formed under said first and second extension-forming side walls.

3. The semiconductor device according to claim 1, wherein said gate electrode is formed by using a gate electrode material including a gate electrode material of the first conductivity type.

* * * * *